(12) United States Patent
Kim et al.

(10) Patent No.: US 12,268,060 B2
(45) Date of Patent: Apr. 1, 2025

(54) DISPLAY DEVICE AND METHOD OF PROVIDING THE SAME

(71) Applicant: Samsung Display Co., LTD., Yongin-si (KR)

(72) Inventors: Yoon Ho Kim, Asan-si (KR); Jong Woo Park, Seongnam-si (KR); June Hwan Kim, Daejeon (KR); Tae Young Kim, Seongnam-si (KR); Ki Ju Im, Suwon-si (KR); Eun Byul Jo, Daegu (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 503 days.

(21) Appl. No.: 17/400,274

(22) Filed: Aug. 12, 2021

(65) Prior Publication Data

US 2022/0208923 A1     Jun. 30, 2022

(30) Foreign Application Priority Data

Dec. 28, 2020   (KR) ........................ 10-2020-0184673

(51) Int. Cl.
*H10K 59/126*     (2023.01)
*H01L 29/66*     (2006.01)
(Continued)

(52) U.S. Cl.
CPC ..... *H10K 59/126* (2023.02); *H01L 29/66742* (2013.01); *H01L 29/7869* (2013.01);
(Continued)

(58) Field of Classification Search
CPC .. H10K 59/126; H10K 59/124; H10K 59/751; H10K 59/12–1315;
(Continued)

(56) References Cited

U.S. PATENT DOCUMENTS 10,622,430 B2    4/2020    Jeong et al.
10,998,393 B2    5/2021    Jeong et al.
(Continued)

FOREIGN PATENT DOCUMENTS

CN      111564458 A     8/2020
CN      111710685 A     9/2020
(Continued)

*Primary Examiner* — Joseph C. Nicely
*Assistant Examiner* — Alvin L Lee
(74) *Attorney, Agent, or Firm* — CANTOR COLBURN LLP

(57) ABSTRACT

A display device includes a substrate, a first semiconductor layer on the substrate and including an oxide semiconductor, a first gate insulating film on the first semiconductor layer, a first conductive layer on the first gate insulating film, a first interlayer insulating film on the first conductive layer, and a second conductive layer on the first interlayer insulating film and connected to the first semiconductor layer through a through-hole. The through-hole includes a first through-hole passing through the first interlayer insulating film, and a second through-hole overlapping the first through-hole and passing through the first semiconductor layer. The second conductive layer is in contact with a side surface of the first semiconductor layer exposed at the second through-hole.

16 Claims, 14 Drawing Sheets

(51) Int. Cl.
  *H01L 29/786* (2006.01)
  *H10K 59/12* (2023.01)
  *H10K 59/124* (2023.01)

(52) U.S. Cl.
  CPC ..... *H01L 29/78696* (2013.01); *H10K 59/124* (2023.02); *H10K 59/1201* (2023.02)

(58) Field of Classification Search
  CPC ........... H01L 29/66742; H01L 29/7869; H01L 29/78696; H01L 27/0688; H01L 27/1214–1251; H01L 27/1255; H01L 29/66969; H01L 21/02565; H01L 29/78692; H01L 29/78693
  See application file for complete search history.

(56) References Cited

U.S. PATENT DOCUMENTS

| | | |
|---|---|---|
| 11,177,288 B2 | 11/2021 | Lee et al. |
| 11,600,678 B2 | 3/2023 | Jeong et al. |
| 12,052,893 B2 | 7/2024 | Jeong et al. |
| 2011/0101333 A1* | 5/2011 | Shionoiri .......... H01L 21/76254 257/43 |
| 2015/0255490 A1* | 9/2015 | Miyairi ............... H01L 29/7869 257/43 |
| 2017/0278916 A1* | 9/2017 | Maruyama ......... H10K 59/1213 |
| 2019/0378886 A1* | 12/2019 | Jeong .................... H01L 21/477 |
| 2020/0135772 A1* | 4/2020 | Lee ........................ G11C 19/28 |
| 2020/0185423 A1* | 6/2020 | Hu ...................... H01L 27/1218 |
| 2021/0366945 A1* | 11/2021 | Sakai .................. H01L 27/1225 |
| 2024/0357867 A1 | 10/2024 | Jeong et al. |

FOREIGN PATENT DOCUMENTS

| | | |
|---|---|---|
| KR | 10-0491146 B1 | 5/2005 |
| KR | 20190141048 A | 12/2019 |
| KR | 20200048910 A | 5/2020 |
| KR | 1020210007073 A | 1/2021 |

* cited by examiner

110: 111
120: 121, 122
140: 142
150: 151, 152, 153, 154
160: 161
170: 171, 172, 173

DISPLAY DEVICE AND METHOD OF PROVIDING THE SAME

This application claims priority to Korean Patent Application No. 10-2020-0184673 filed on Dec. 28, 2020, and all the benefits accruing therefrom under 35 U.S.C. 119, the contents of which in its entirety are herein incorporated by reference.

BACKGROUND

1. Field

The disclosure relates to a display device and a method of providing the same.

2. Description of the Related Art

With the advancement of the information society, requirements for a display device for displaying an image are increasing in various forms. For example, the display device is applied to various electronic devices such as a smartphone, a digital camera, a laptop computer, a navigation device, and a smart television ("TV").

The display device is becoming increasingly important with the development of multimedia. In response to this, various kinds of display devices such as a liquid crystal display ("LCD") device, an organic light-emitting display ("OLED") device, and the like are being used. Among the display devices, the OLED device displays an image using an organic light-emitting element that generates light by recombination of electrons and holes. The OLED device includes a plurality of transistors that provide a drive current to the organic light-emitting element.

Each of the plurality of transistors may include an active layer, and the active layers of the plurality of transistors may be made of different materials.

SUMMARY

One or more embodiment provides a display device in which the number of masks used in a process of providing the display device is reduced and a method of providing the display device using the same.

Embodiments are not limited to the features mentioned above, and other technical features not mentioned above will be clearly understood by those skilled in the art from the following description.

An embodiment of a display device includes a substrate, a first semiconductor layer on the substrate and including an oxide semiconductor, a first gate insulating film on the first semiconductor layer, a first conductive layer on the first gate insulating film, a first interlayer insulating film on the first conductive layer, and a second conductive layer on the first interlayer insulating film and connected to the first semiconductor layer through a through-hole. The through-hole includes a first through-hole passing through the first interlayer insulating film, and a second through-hole overlapping the first through-hole and passing through the first semiconductor layer. The second conductive layer is in contact with a side surface of the first semiconductor layer exposed at the second through-hole.

An embodiment of a display device includes a light-emitting element, a first transistor which controls a driving current flowing through the light-emitting element according to a voltage applied to a gate electrode, and a second transistor between a second source/drain electrode of the first transistor and the gate electrode of the first transistor. The first transistor includes a first active layer of a first semiconductor layer, and the second transistor includes a second active layer of a second semiconductor layer different from the first semiconductor layer. The second active layer of the second transistor includes a through-hole, and a first source/drain electrode and a second source/drain electrode of the second transistor are in contact with a side surface of the second active layer defining the through-hole.

An embodiment of a method of providing a display device includes preparing a substrate on which a first semiconductor layer is disposed, a first gate insulating film on the first semiconductor layer, a first conductive layer on the first gate insulating film, a first interlayer insulating film on the first conductive layer, a second semiconductor layer on the first interlayer insulating film, a second gate insulating film on the second semiconductor layer, a second conductive layer on the second gate insulating film, and a second interlayer insulating film on the second conductive layer; and forming both a contact hole passing through the second interlayer insulating film, the second gate insulating film, the first interlayer insulating film and the first gate insulating film and exposing the first semiconductor layer to outside the contact hole, and a through-hole passing through the second interlayer insulating film and the second semiconductor layer, by using a first etching mask.

According to one or more embodiment of a display device and a method of providing the display device, the number of masks can be reduced, thereby reducing process costs and increasing process efficiency.

Effects according to the embodiments are not limited by the contents illustrated above, and more various effects are included in the present specification.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
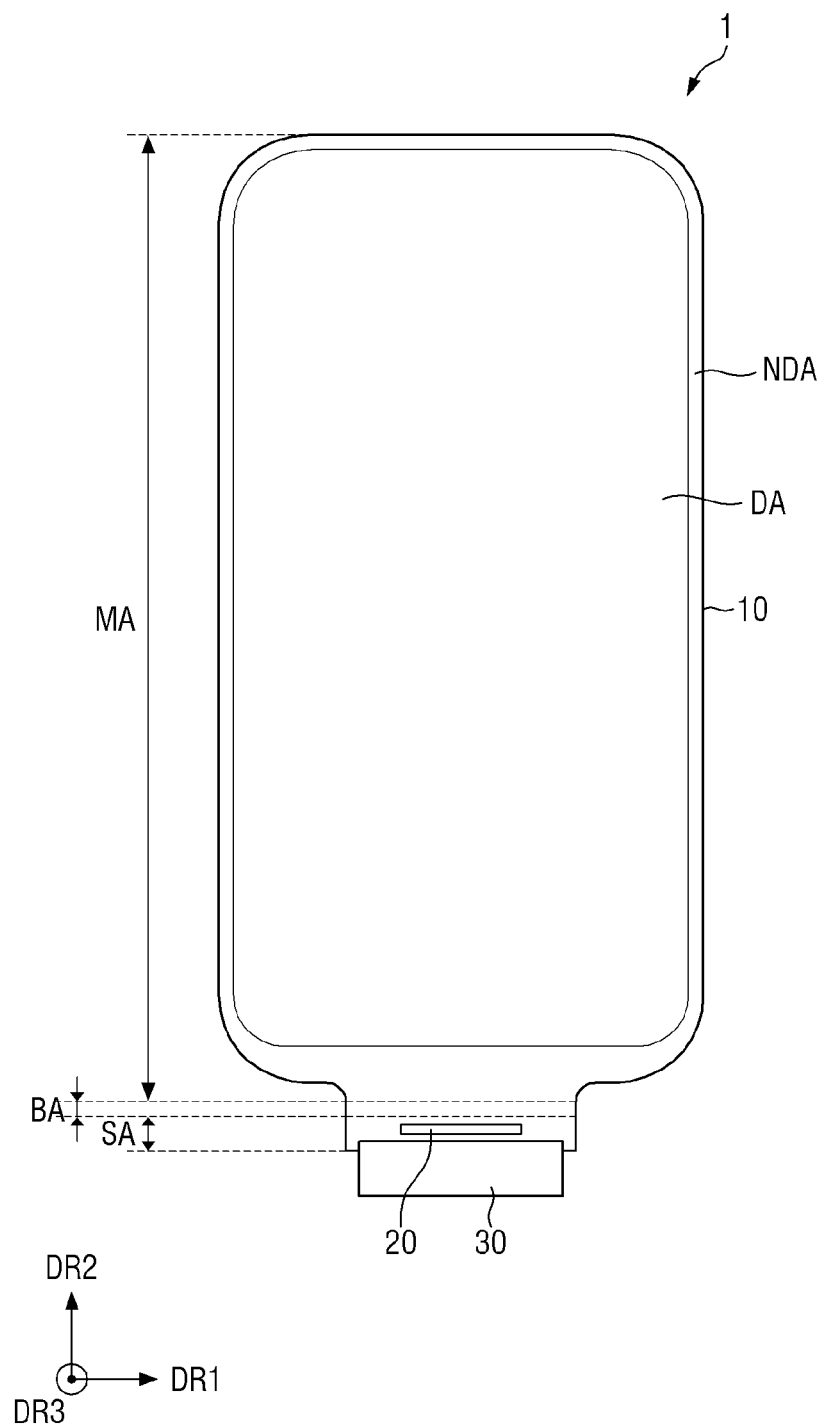
FIG. 1 is a plan view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layers are present.

The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, detailed embodiments will be described with reference to the accompanying drawings.

Figure 2:
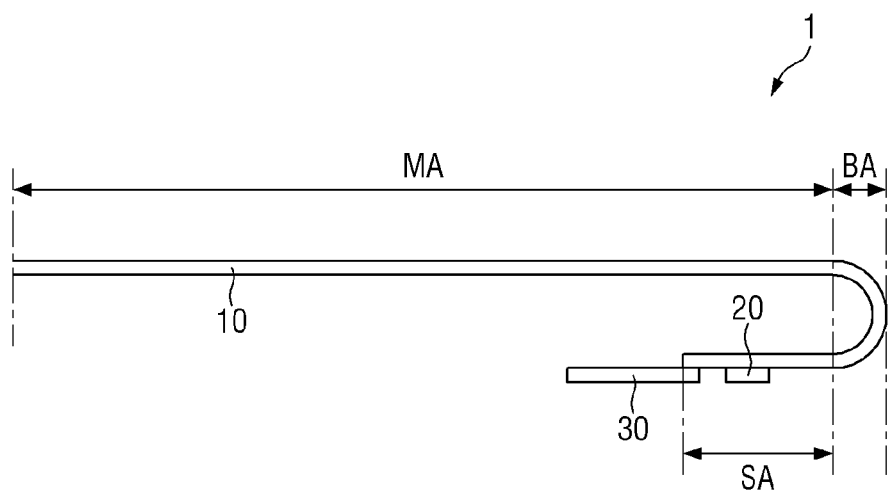
FIG. 2 is a cross-sectional view of the display device of FIG. 1 which is bent.
Figure 2:
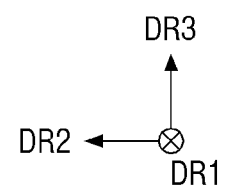

FIG. 1 is a plan view of an embodiment of a display device 1. FIG. 2 is an enlarged cross-sectional view of the display device 1 of FIG. 1 which is bent. FIG. 2 shows a side view of an end portion of the display device 1 which is bent along a thickness direction.

A display device 1 is a device for displaying a moving image and/or a still image. The display device 1 may be used as a display screen of various products such as a television, a laptop computer, a monitor, a billboard, an Internet of Things device, and the like as well as portable electronic devices such as a mobile phone, a smart phone, a tablet personal computer ("PC"), a smart watch, a watch phone, a mobile communication terminal, an electronic notebook, an e-book reader, a portable multimedia player ("PMP"), a navigation device, an ultra-mobile PC ("UMPC"), and the like.

The display device 1 may have a substantially rectangular shape on a plane (e.g., in a plan view, that is, along the thickness direction). The display device 1 may have a rectangular shape of which corners have a right angle on a plane. However, the invention is not limited thereto, and the display device 1 may have a rectangular shape with rounded corners on a plane.

In the drawing, a first direction DR1 indicates a lateral direction of the display device 1 in a plan view, and a second direction DR2 indicates a longitudinal direction of the display device 1 in a plan view which crosses the first direction DR1. In addition, a third direction DR3 indicates a thickness direction of the display device 1 which crosses each of the first direction DR1 and the second direction DR2. In an embodiment, the first direction DR1 and the second direction DR2 perpendicularly cross each other, and the third direction DR3 is a direction crossing a plane on which the first and second directions DR1 and DR2 are placed, and perpendicularly crosses both the first direction DR1 and the second direction DR2. However, the directions mentioned in the embodiments should be understood as referring to relative directions, and the embodiments are not limited to the mentioned directions. Referring to FIG. 1, the display device 1 which is unbent may be disposed in a plane defined by the first direction DR1 and the second direction DR2 crossing each other.

Unless otherwise defined, in the present specification, the terms "upper portion", "upper surface", and "upper side" expressed with respect to the third direction DR3 refer to a display surface side with respect to a display panel 10, and the terms "lower portion", "lower surface" and "lower side" refer to an opposite side of the display surface with respect to the display panel 10 (e.g., in a direction opposite to the third direction DR3). In FIGS. 1 and 2, for example, a display surface may be a surface which is furthest in the third direction DR3, without being limited thereto.

Referring to FIGS. 1 and 2, the display device 1 may include the display panel 10. The display panel 10 may include a flexible substrate containing a flexible polymeric material such as polyimide. Accordingly, the display panel 10 is bendable, foldable, or rollable.

The display panel 10 may be an organic light-emitting display panel. In the following embodiment, it is illustrated that the organic light-emitting display panel is applied as the display panel 10, but the invention is not limited thereto, and other types of display panels, such as a liquid crystal display panel, a quantum dot organic light-emitting display panel, a quantum dot liquid crystal display panel, a quantum nano light-emitting display panel, and a micro light-emitting diode ("micro LED") may be applied.

The display panel 10 may include a display area DA for displaying an image and a non-display area NDA in which the image is not displayed. The display panel 10 may be divided into the display area DA and the non-display area NDA in a plan view. The non-display area NDA may be disposed adjacent to the display area DA. In an embodiment, the non-display area NDA may be disposed to surround the display area DA. The non-display area NDA may form or correspond to a bezel of the display device 1. Various components or layers of the display device 1 may include a display area DA and a non-display area NDA corresponding to those described above for the display device 1.

The display area DA may have a rectangular shape with right-angled corners or a rectangular shape with rounded corners on a plane. The display area DA may have a short side and a long side. The short side of the display area DA may be a side extending in or along the first direction DR1. The long side of the display area DA may be a side extending in or along the second direction DR2. However, the planar shape of the display area DA is not limited to the rectangular shape, and may have a circular shape, an elliptical shape, or other various shapes.

The display area DA may include a plurality of pixels. The pixels may be arranged in a matrix shape. Each pixel may include an emission layer and a circuit layer that controls an amount of light generated and/or emitted from the emission layer. The circuit layer may include a wiring, an electrode, and at least one transistor. The emission layer may contain an organic light-emitting material. The emission layer may be sealed by an encapsulation film. The specific configuration of the pixels will be described later.

The non-display area NDA may be disposed adjacent to both short sides and both long sides of the display area DA. In this case, it is possible to surround all sides of the display area DA, and constitute an edge of the display area DA. However, the invention is not limited thereto, and the non-display area NDA may be disposed adjacent to only both short sides or only both long sides of the display area DA.

The display panel 10 may include a main area MA and a bending area BA which is connected to and extends from one side of the main area MA in the second direction DR2. The display panel 10 may further include a sub area SA connected to the bending area BA at one side thereof along the second direction DR2. The display panel 10 is bendable at the bending area BA. The display panel 10 which is bent in the thickness direction disposes the sub area SA to overlap the main area MA in the thickness direction.

The display area DA may be positioned in the main area MA. The non-display area NDA may be positioned at an edge portion around the display area DA of the main area MA.

The main area MA may have a shape similar to an outer shape on a plane of the display device 1. The main area MA may be a flat area positioned in one plane. However, the invention present disclosure is not limited thereto, and at least one of edges other than an edge (side) connected to the bending area BA of the main area MA may be bent to form a curved surface, or may be bent in a vertical direction.

When at least one of the edges other than the edge (side) connected to the bending area BA of the main area MA defines a curved surface or is bent, the display area DA may also be disposed at the corresponding edge. However, the invention is not limited thereto, and the non-display area NDA that does not display an image may be disposed at the curved surface or the bent edge, or the display area DA and the non-display area NDA may be disposed together.

The non-display area NDA of the main area MA may be placed in an area from an outer boundary of the display area DA to an edge of the display panel 10. Signal lines or driving circuits for applying a signal to the display area DA may be disposed in the non-display area NDA of the main area MA.

The bending area BA may be connected to one short side of the main area MA. A width of the bending area BA (e.g., a width in the first direction DR1) may be smaller than a width of the main area MA (e.g., a width of the short side). A connecting portion between the main area MA and the bending area BA may have an L shape to reduce a width of the bezel.

In the bending area BA, the display panel 10 may be bendable with a curvature in a direction opposite to the display surface (e.g., direction opposite to the third direction DR3). The display panel 10 which is bent at the bending area BA may reverse a direction of a surface of the display panel 10. That is, one surface of the display panel 10 facing upward (e.g., to the third direction DR3 in FIG. 1) may be changed so as to face an outer side of the side surface through the bending area BA and then face downward again (e.g., along the second direction DR2 and to the direction opposite to the third direction DR3 in FIG. 2).

The sub area SA extends from the bending area BA. Referring to FIG. 2, the sub area SA may start at a position where a bent area terminates and extend from the bending area BA in a direction parallel to the main area MA. The display panel 10 which is bent may dispose the sub area SA to overlap the main area MA in the thickness direction of the display panel 10. The sub area SA may overlap the non-display area NDA of an edge of the main area MA, and may further overlap the display area DA of the main area MA. A width of the sub area SA may be the same as the width of the bending area BA (e.g., a width in the first direction DR1), but the invention is not limited thereto.

A pad portion may be disposed in the sub area SA of the display panel 10. An external device may be mounted (or attached) to the display panel 10 at the pad portion. Examples of the external device may include a driving chip 20, a driving substrate 30 made of a flexible printed circuit board or a rigid printed circuit board, and the like. In addition, a wiring connecting film, a connector, and the like may be mounted on the pad portion as the external device.

The number of external devices mounted on the sub area SA may be one, but may be plural. As illustrated in FIGS. 1 and 2, for example, the driving chip 20 may be disposed in the sub area SA of the display panel 10, and the driving substrate 30 may be attached to the display panel 10 at an end portion of the sub area SA. In this case, the display panel 10 may include both a pad portion connected to the driving chip 20 and the pad portion connected to the driving substrate 30. In an embodiment, the driving chip 20 may be mounted on a film, and the film may be attached to the sub area SA of the display panel 10. An electrical signal (e.g., control signal, driving signal, scan signal, data voltage, image signal, etc.) may be provided to the display panel 10, through the pad portion, from outside of the display panel 10. An external device which is outside the display panel 10 may provide the electrical signal. The electrical signal may be provided from the pad area to pixels of the display panel 10.

The driving chip 20 may be mounted on one surface of the display panel 10 that is the same surface as the display surface or that is an extended portion thereof. As described above, where the display panel 10 is bent at the bending area BA to reverse a surface, the driving chip 20 is mounted on the surface of the display panel 10 facing downward in the thickness direction, and thus an upper surface of the driving chip 20 may face downward.

The driving chip 20 may be attached to the display panel 10 through an anisotropic conductive film, or may be attached to the display panel 10 through ultrasonic bonding. A width of the driving chip 20 in the lateral direction may be smaller than a width of the display panel 10 in the lateral direction. The driving chip 20 may be disposed at a center portion of the sub area SA in the lateral direction (e.g., first direction DR1), and left and right edges of the driving chip 20 may be spaced apart from left and right edges of the sub area SA, respectively.

The driving chip 20 may include an integrated circuit that drives the display panel 10. In an embodiment, the integrated circuit may be a data driving integrated circuit that generates and provides a data signal DATA, but the invention is not limited thereto. The driving chip 20 is connected to a wiring pad provided in the pad portion of the display panel 10 to provide the data signal DATA to the wiring pad. The wirings connected to the wiring pad extend toward the pixels to apply the data signal DATA or the like to each pixel.

Figure 3:
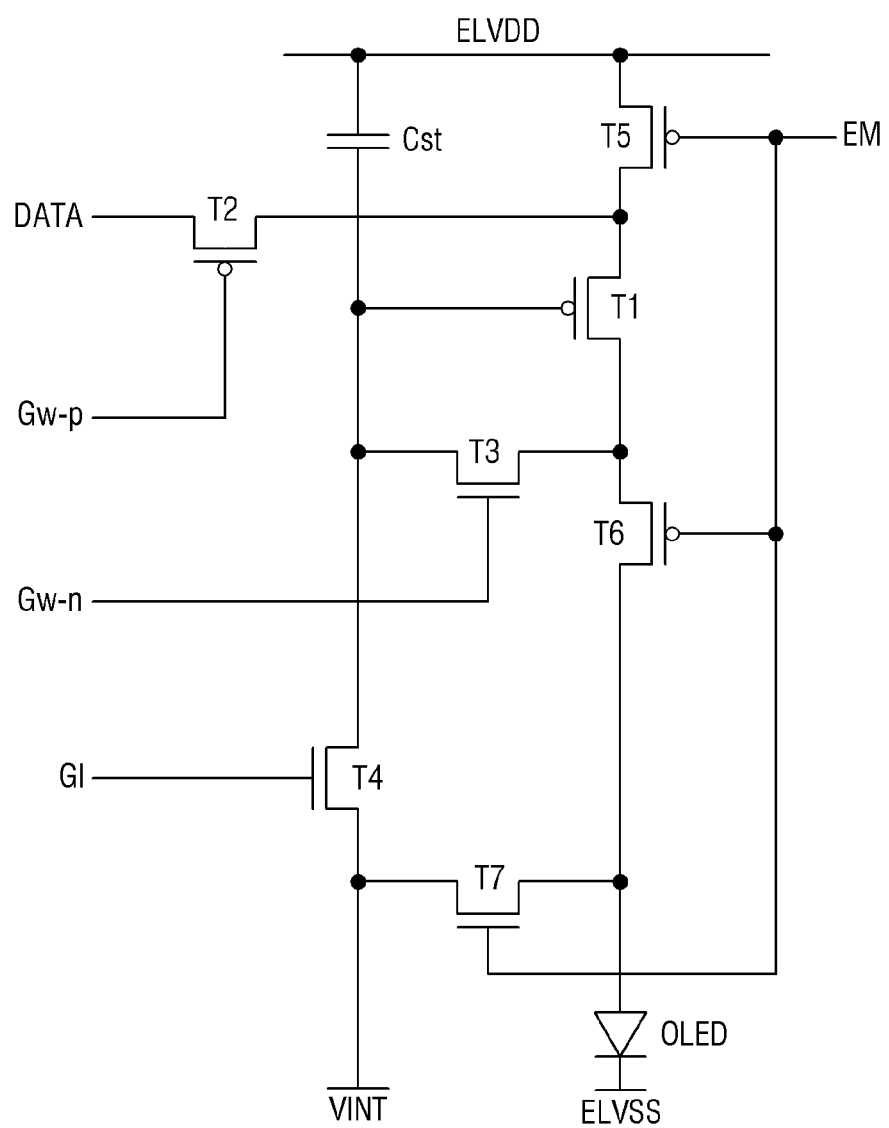
FIG. 3 is an equivalent circuit diagram of an embodiment of a pixel of the display device.

FIG. 3 is an equivalent circuit diagram of an embodiment of a pixel of the display device 1.

Referring to FIG. 3, a circuit of one pixel of an organic light-emitting display device includes an organic light-emitting diode OLED (e.g., light-emitting element), a plurality of transistors T1 to T7, and a capacitor Cst. A data signal DATA (e.g., a data voltage or image signal), a first scan signal Gw-p, a second scan signal Gw-n, a third scan signal GI, a light emission control signal EM, a first power voltage ELVDD, a second power voltage ELVSS, and an initialization voltage VINT are applied to the circuit of one pixel.

The organic light-emitting diode OLED includes an anode ANO and a cathode CAT. The capacitor Cst includes a first electrode and a second electrode 121.

The plurality of transistors may include first to seventh transistors T1 to T7. Each of the transistors T1 to T7 includes a gate electrode, a first source/drain transistor electrode, and a second source/drain transistor electrode. One of the first source/drain transistor electrode and the second source/drain transistor electrode of each of the transistors T1 to T7 serves as a source electrode and the other serves as a drain electrode.

Each of the transistors T1 to T7 may be a thin film transistor. Each of the transistors T1 to T7 may be one of a PMOS transistor and an NMOS transistor. In an embodiment, the first transistor T1 which is a driving transistor, the second transistor T2 which is a data transfer transistor, the fifth transistor T5 which is a first emission control transistor and the sixth transistor T6, which is a second emission control transistor are PMOS transistors. On the other hand, the third transistor T3 which is a compensation transistor, the fourth transistor T4 which is a first initialization transistor, and the seventh transistor T7 which is a second initialization transistor are NMOS transistors. The characteristics of the PMOS transistor and the NMOS transistor are different from each other, and it is possible to reduce leakage of an electrical driving current during a light-emitting period of the organic light-emitting diode OLED by forming (or providing) the third transistor T3, the fourth transistor T4, and the seventh transistor T7 as NMOS transistors having relatively excellent turn-off characteristics.

Hereinafter, each configuration will be described in detail.

The gate electrode of the first transistor T1 is connected to the first electrode of the capacitor Cst. The first source/drain transistor electrode of the first transistor T1 is connected to a first power voltage ELVDD terminal via the fifth transistor T5. The second source/drain transistor electrode of the first transistor T1 is connected to the anode ANO of the organic light-emitting diode OLED via the sixth transistor T6. The first transistor T1 receives the data signal DATA according to a switching operation of the second transistor T2 to supply the electrical driving current to the organic light-emitting diode OLED.

The gate electrode of the second transistor T2 is connected to a first scan signal Gw-p terminal. The first source/drain transistor electrode of the second transistor T2 is connected to a data signal DATA terminal. The second source/drain transistor electrode of the second transistor T2 is connected to the first source/drain transistor electrode of the first transistor T1 and is connected to the first power voltage ELVDD terminal via the fifth transistor T5. The second transistor T2 is turned on according to the first scan signal Gw-p to perform a switching operation of transmitting the data signal DATA to the first source/drain transistor electrode of the first transistor T1.

The gate electrode of the third transistor T3 is connected to a second scan signal Gw-n terminal. The first source/drain transistor electrode of the third transistor T3 is connected to the second source/drain transistor electrode of the first transistor T1 and is connected to the anode ANO of the organic light-emitting diode OLED via the sixth transistor T6. The second source/drain transistor electrode of the third transistor T3 is connected to the first electrode of the capacitor Cst, the first source/drain transistor electrode of the fourth transistor T4, and the gate electrode of the first transistor T1. The third transistor T3 is turned on according to the second scan signal Gw-n and connects the gate electrode of the first transistor T1 and the second source/ drain transistor electrode to each other to diode-connect the first transistor T1. Accordingly, a voltage difference is generated between the first source/drain transistor electrode and the gate electrode of the first transistor T1 by a threshold voltage of the first transistor T1, and a deviation of the threshold voltage of the first transistor T1 may be compensated for by supplying the data signal DATA of which the threshold voltage is compensated to the gate electrode of the first transistor T1.

The gate electrode of the fourth transistor T4 is connected to a third scan signal GI terminal. The second source/drain transistor electrode of the fourth transistor T4 is connected to an initialization voltage VINT terminal. The first source/drain transistor electrode of the fourth transistor T4 is connected to the first electrode of the capacitor Cst, the second source/drain transistor electrode of the third transistor T3, and the gate electrode of the first transistor T1. The fourth transistor T4 is turned on according to the third scan signal GI and transmits the initialization voltage VINT to the gate electrode of the first transistor T1 to perform an operation of initializing a voltage of the gate electrode of the first transistor T1.

The gate electrode of the fifth transistor T5 is connected to a light emission control signal EM terminal. The first source/drain transistor electrode of the fifth transistor T5 is connected to the first power voltage ELVDD terminal. The second source/drain transistor electrode of the fifth transistor T5 is connected to the first source/drain transistor electrode of the first transistor T1 and the second source/drain transistor electrode of the second transistor T2.

The gate electrode of the sixth transistor T6 is connected to the light emission control signal EM terminal. The first source/drain transistor electrode of the sixth transistor T6 is connected to the second source/drain transistor electrode of the first transistor T1 and the first source/drain transistor electrode of the third transistor T3. The second source/drain transistor electrode of the sixth transistor T6 is connected to the anode ANO of the organic light-emitting diode OLED.

The fifth transistor T5 and the sixth transistor T6 are simultaneously turned on according to the light emission control signal EM, and accordingly, an electrical driving current flows through the organic light-emitting diode OLED.

The gate electrode of the seventh transistor T7 is connected to the light emission control signal EM terminal. The first source/drain transistor electrode of the seventh transistor T7 is connected to the anode ANO of the organic light-emitting diode OLED. The second source/drain transistor electrode of the seventh transistor T7 is connected to the initialization voltage VINT terminal. The seventh transistor T7 is turned on according to the light emission control signal EM to initialize the anode ANO of the organic light-emitting diode OLED.

The seventh transistor T7 receives the same light emission control signal EM as the fifth transistor T5 and the sixth transistor T6, but the seventh transistor T7 is an NMOS transistor, while the fifth transistor T5 and the sixth transistor T6 are PMOS transistors, and thus the seventh transistor T7, and the fifth transistor T5 and the sixth transistor T6 may be turned on at different timings from each other. That is, when the light emission control signal EM is at a high level, the seventh transistor T7 is turned on and the fifth transistor T5 and the sixth transistor T6 are turned off. When the light emission control signal EM is at a low level, the seventh transistor T7 is turned off, and the fifth and sixth transistors T5 and T6 are turned on. Therefore, an initialization operation by the seventh transistor T7 may not be performed in a light emission time period during which the fifth transistor T5 and the sixth transistor T6 are turned on, and the initialization operation by the seventh transistor T7 may be performed in a non-light emission time period during which the fifth transistor T5 and the sixth transistor T6 are turned off.

The embodiment illustrates a case in which the gate electrode of the seventh transistor T7 receives the light emission control signal EM is illustrated, but in an embodiment, a pixel circuit may be configured such that the gate electrode of the seventh transistor T7 receives the third scan signal GI, or receives a separate scan signal.

The second electrode 121 of the capacitor Cst is connected to the first power voltage ELVDD terminal. The first electrode of the capacitor Cst is connected to the gate electrode of the first transistor T1, the second source/drain transistor electrode of the third transistor T3, and the first source/drain transistor electrode of the fourth transistor T4. The cathode CAT of the organic light-emitting diode OLED is connected to a second power voltage ELVSS terminal. The organic light-emitting diode OLED displays an image by receiving an electrical driving current from the first transistor T1 and emitting light.

Figure 4:
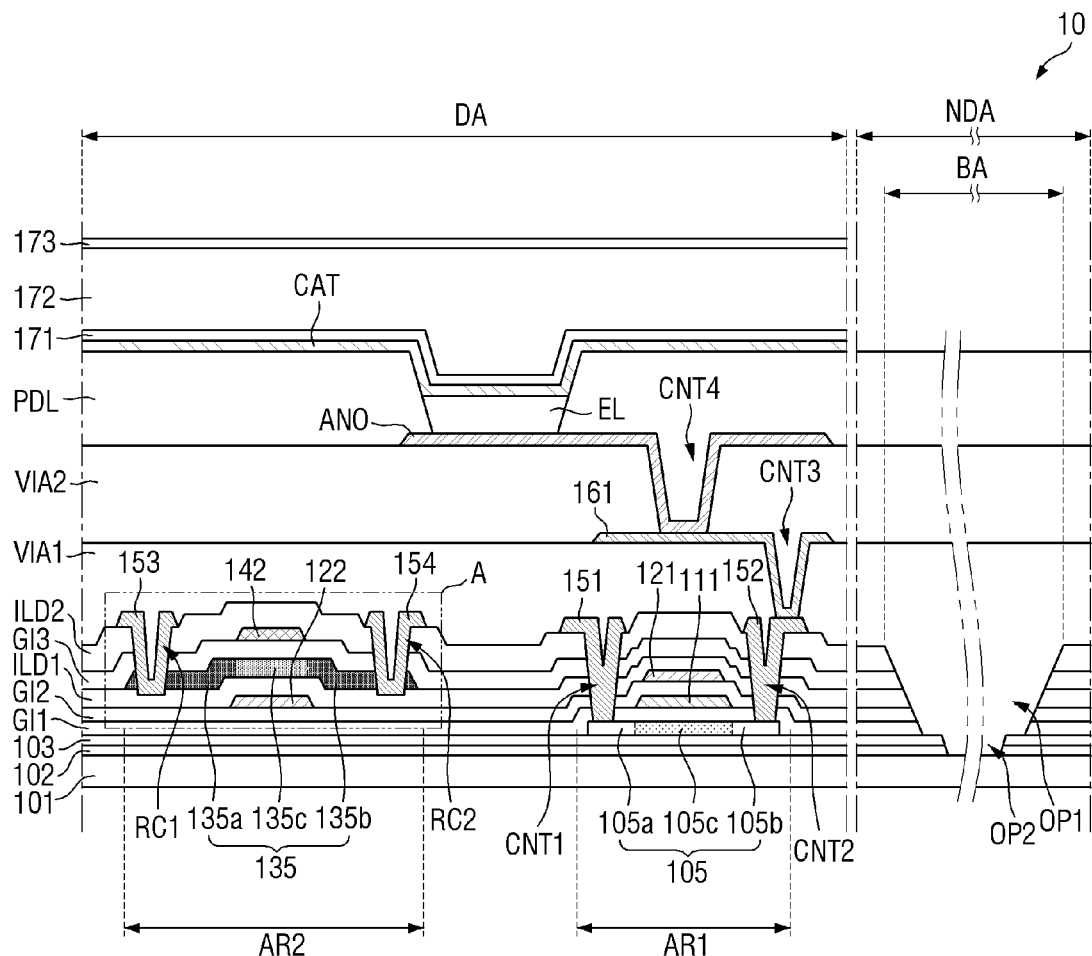
FIG. 4 is an enlarged cross-sectional view showing an embodiment of a pixel in a display area and a bending area in a non-display area of a display panel.
Figure 5:
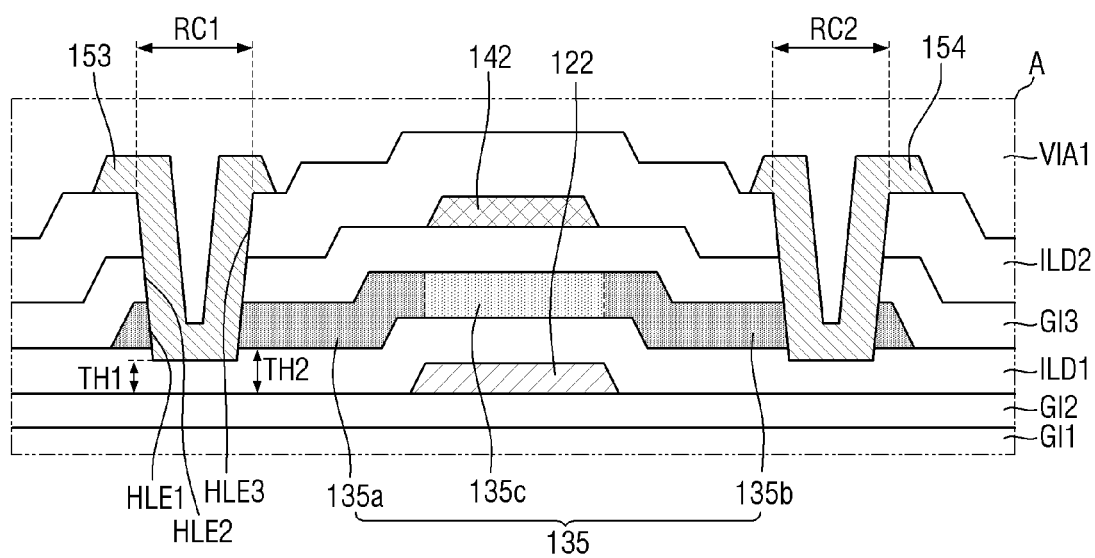
FIG. 5 is an enlarged view of region A in FIG. 4.
Figure 6:
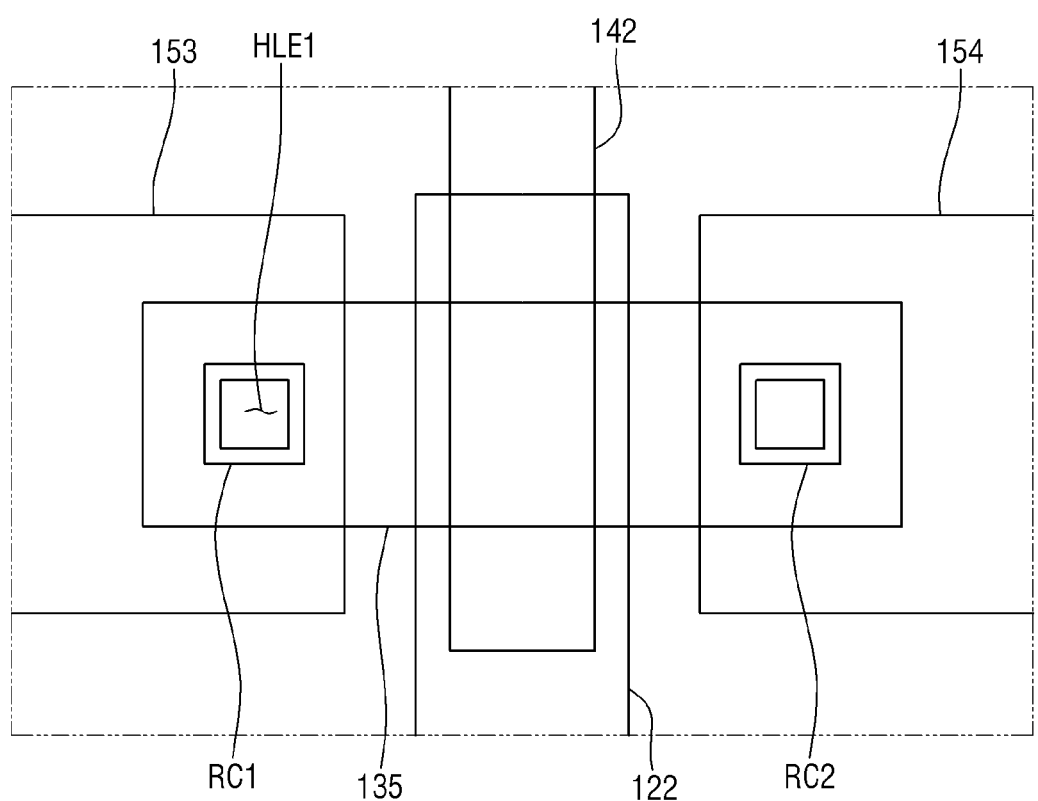
FIG. 6 is an enlarged plan view showing an embodiment of a periphery of an oxide semiconductor layer of FIG. 5.

Hereinafter, a cross-sectional structure of the display panel 10 will be described in detail with reference to FIGS. 4 to 6. FIG. 4 illustrates a cross-sectional structure of one pixel of the display area DA and a portion of the non-display area NDA including the bending area BA in the display panel 10.

FIG. 4 is an enlarged cross-sectional of an embodiment of a pixel in the display area DA and a portion of the bending area BA in the non-display area NDA. FIG. 5 is an enlarged view of region A in FIG. 4. FIG. 6 is a plan view briefly showing a periphery of an oxide semiconductor layer of FIG. 5.

The display area DA of the display panel 10 will be described first with reference to FIGS. 4 to 6.

The display area DA may include a silicon transistor region AR1 in which a non-oxide inorganic semiconductor transistor (hereinafter, abbreviated as a "silicon transistor") including polycrystalline silicon is disposed as a channel, and an oxide transistor region AR2 in which an oxide semiconductor transistor (hereinafter, abbreviated as an "oxide transistor") including an oxide semiconductor is disposed as a channel.

The silicon transistor disposed in the silicon transistor region AR1 may be a PMOS transistor, and FIG. 4 illustrates the first transistor T1 that is a driving transistor as an example of the silicon transistor. The oxide transistor disposed in the oxide transistor region AR2 may be an NMOS transistor, and FIG. 4 exemplarily illustrates the third transistor T3 that is a compensation transistor as an example of the oxide transistor.

The second transistor T2, the fifth transistor T5, and the sixth transistor T6 are disposed in the silicon transistor region AR1, and are different silicon transistors. The second transistor T2, the fifth transistor T5, and the sixth transistor T6 may have substantially the same stacked structure as the first transistor T1. The fourth transistor T4 and the seventh transistor T7 are disposed in the oxide transistor region AR2, and are different oxide transistors. The fourth transistor T4 and the seventh transistor T7 may have substantially the same stacked structure as the third transistor T3. Detailed descriptions of the silicon transistor and the oxide transistor will be described later.

In the display area DA of the display panel 10, a substrate 101, a barrier layer 102, a buffer layer 103, a silicon semiconductor layer 105 (e.g., first semiconductor layer, non-oxide semiconductor active layer, first semiconductor active layer or third semiconductor active layer), a first gate insulating film GI1 (e.g., first gate insulating layer), a first conductive layer 110, a second gate insulating film GI2 (e.g., second gate insulating layer), a second conductive layer 120, a first interlayer insulating film ILD1 (e.g., first interlayer insulating layer), an oxide semiconductor layer 135 (e.g., second semiconductor layer, oxide semiconductor active layer or second semiconductor active layer), a third gate insulating film GI3 (e.g., third gate insulating layer), a third conductive layer 140, a second interlayer insulating film ILD2 (e.g., second interlayer insulating layer), a fourth conductive layer 150, a first via layer VIA1, a fifth conductive layer 160, a second via layer VIA2, an anode ANO, and a pixel defining film PDL (e.g., pixel defining layer) may be sequentially disposed. Each of the above-described layers may be formed of or include a single film, but may be formed of or include a stacked film including a plurality of films. Other layers may be further disposed between each of the layers.

The substrate 101 supports each of the layers disposed thereon. The substrate 101 may be made of or include, for example, an insulating material such as a polymer resin. Examples of polymer materials may include polyethersulfone ("PES"), polyacrylate ("PA"), polyarylate ("PAR"), polyetherimide ("PEI"), polyethylene napthalate ("PEN"), polyethyleneterepthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The substrate 101 may contain a metal material.

The substrate 101 may be a flexible substrate capable of bending, folding, or rolling. An example of a material forming the flexible substrate may include polyimide ("PI"), but the invention is not limited thereto.

When an organic light-emitting display device is a backside or double-sided emission type, a transparent substrate may be used. When the organic light-emitting display is a top emission type, not only a transparent substrate but also a translucent or opaque substrate may be applied.

The barrier layer 102 may be disposed on the substrate 101. The barrier layer 102 may reduce or effectively prevent diffusion of impurity ions, may reduce or effectively prevent penetration of moisture to the outside air, and may perform a surface planarization function. The barrier layer 102 may include silicon nitride, silicon oxide, or silicon oxynitride. The barrier layer 102 may be omitted depending on the type of the substrate 101, process conditions, and the like.

The buffer layer 103 may be disposed on the barrier layer 102. The buffer layer 103 may include at least one of silicon nitride, silicon oxide, and silicon oxynitride. The buffer layer 103 may be omitted depending on the type of the substrate 101, process conditions, and the like.

The silicon semiconductor layer 105 may be disposed on the buffer layer 103. The silicon semiconductor layer 105 may be disposed in the silicon transistor region AR1.

The silicon semiconductor layer 105 may include a non-oxide semiconductor (e.g., non-oxide semiconductor material). In an embodiment, for example, the silicon semiconductor layer 105 may be made of polycrystalline silicon, single crystal silicon, amorphous silicon, or the like. When the silicon semiconductor layer 105 is made of polycrystalline silicon, the polycrystalline silicon may be formed by crystallizing amorphous silicon using a crystallization method such as a rapid thermal annealing ("RTA") method, a solid phase crystallization ("SPC") method, an excimer laser annealing ("ELA") method, a metal induced crystallization ("MIC") method, a metal induced lateral crystallization ("MILC") method, or a sequential lateral solidification ("SLS") method.

The silicon semiconductor layer 105 may include a channel region 105c (e.g., first channel region) disposed to overlap a first gate electrode 111 thereabove in the thickness direction, and a first source/drain region 105a (e.g., first region) and a second source/drain region 105b (e.g., second region) of the silicon semiconductor layer 105 which are respectively positioned on one side (e.g., a first side) and the other side (e.g., a second side opposite to the first side) of the channel region 105c. Since a plurality of carrier ions are contained in the first and second source/drain regions 105a and 105b of the silicon semiconductor layer 105, the first and second source/drain regions 105a and 105b may have higher conductivity and lower electrical resistance than the channel region 105c.

The silicon semiconductor layer 105 may include the semiconductor layers (or an active layer) of the first transistor T1, the second transistor T2, the fifth transistor T5, and the sixth transistor T6 described above, and may form a channel of the corresponding transistor. In other words, the silicon semiconductor layer 105 may include the channel region 105c, the first source/drain region 105a, and the second source/drain region 105b of each of the first transistor T1, the second transistor T2, the fifth transistor T5, and the sixth transistor T6 described above.

The first gate insulating film GI1 may be disposed on the silicon semiconductor layer 105. The first gate insulating film GI1 may cover not only an upper surface of the silicon semiconductor layer 105 excluding portions in which a first contact hole and a second contact hole (e.g., contact holes CNT1 and CNT2) are formed but also a side surface of the silicon semiconductor layer 105. The first gate insulating film GI1 may be disposed generally over the entire surface of the substrate 101.

The first gate insulating film GI1 may contain a silicon compound, a metal oxide, or the like. In an embodiment, for example, the first gate insulating film GI1 may contain silicon oxide, silicon nitride, silicon oxynitride, aluminum oxide, tantalum oxide, hafnium oxide, zirconium oxide, titanium oxide, or the like. These may be used alone or in combination with each other.

The first conductive layer 110 is disposed on the first gate insulating film GI1. The first conductive layer 110 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first conductive layer 110 may be a gate conductive layer, and may include the first gate electrode 111 disposed in the silicon transistor region AR1. The first gate electrode 111 may be a gate electrode of the silicon transistor. The first gate electrode 111 may be connected to the first electrode of the capacitor Cst. The first electrode of the capacitor Cst may be formed of the first gate electrode 111 itself or may be formed of a portion extending from the first gate electrode 111 and non-overlapping with the silicon semiconductor layer 105. In an embodiment, for example, a part of patterns of the integrated first conductive layer may overlap the silicon semiconductor layer 105 to function as the first gate electrode 111 at the corresponding portion, and the other part (e.g., extended portion) may function as the first electrode of the capacitor Cst that does not overlap the silicon semiconductor layer 105 and overlaps a second electrode 121 of the capacitor Cst thereabove.

The second gate insulating film GI2 may be disposed on the first conductive layer 110. The second gate insulating film GI2 may cover not only an upper surface of the first gate electrode 111 excluding portions in which the contact holes CNT1 and CNT2 are formed but also a side surface of the first gate electrode 111. The second gate insulating film GI2 may be disposed generally over the entire surface of the first gate insulating film GI1.

The second gate insulating film GI2 may contain a silicon compound, a metal oxide, or the like. In an embodiment, for example, the first gate insulating film GI1 may contain silicon oxide, silicon nitride, silicon oxynitride, aluminum oxide, tantalum oxide, hafnium oxide, zirconium oxide, titanium oxide, or the like. These may be used alone or in combination with each other.

The second conductive layer 120 is disposed on the second gate insulating film GI2. The second conductive layer 120 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second conductive layer 120 may be a capacitor conductive layer, and may include the second electrode 121 of the capacitor Cst disposed in the silicon transistor region AR1 and a lower light blocking pattern 122 (e.g., light blocking pattern). The second electrode 121 of the capacitor Cst may face the first electrode of the capacitor Cst which is connected to the first gate electrode 111 therebelow with the second gate insulating film GI2 interposed therebetween to form the capacitor Cst.

The lower light blocking pattern 122 may serve to prevent light incident from a lower direction of the display panel 10 from entering the oxide semiconductor layer 135 positioned thereon. The lower light blocking pattern 122 may overlap at least a channel region 135c (e.g., second channel region) of the oxide semiconductor layer 135, and may cover at least the channel region 135c of the oxide semiconductor layer 135. However, the invention is not limited thereto, and the lower light blocking pattern 122 may overlap the entire area of the oxide semiconductor layer 135.

The lower light blocking pattern 122 may be used as another gate electrode of the oxide transistor. In this case, the lower light blocking pattern 122 may be electrically connected to a second gate electrode 142 or one of a first source/drain electrode 153 and a second source/drain electrode 154 of the transistor disposed in the oxide transistor region AR2.

The second electrode 121 of the capacitor Cst and the lower light blocking pattern 122 of the capacitor conductive layer may be in a same layer as each other among layers on the substrate 101. As being in a same layer, the second electrode 121 and the lower light blocking pattern 122 may be respective patterns of a same material layer on the substrate 101, without being limited thereto.

The first interlayer insulating film ILD1 is disposed on the second conductive layer 120. The first interlayer insulating film ILD1 may contain a silicon compound, a metal oxide, or the like. In an embodiment, for example, the first interlayer insulating film ILD1 may contain silicon oxide, silicon nitride, silicon oxynitride, aluminum oxide, tantalum oxide, hafnium oxide, zirconium oxide, titanium oxide, or the like. These may be used alone or in combination with each other.

At least a part of the first interlayer insulating film ILD1 may be removed, and accordingly, a part of first and second recess patterns RC1 and RC2 may be defined. The first recess pattern RC1 and the second recess pattern RC2 may expose the first interlayer insulating film ILD1 to outside thereof. The first interlayer insulating film ILD1 may define a first recess and a second recess as a part of the first and second recess patterns RC1 and RC2. Each of the first recess and the second recess may be open in a direction away from the substrate 101.

A first thickness TH1 of the first interlayer insulating film ILD1 at the first recess and exposed by the first recess pattern RC1 and the second recess pattern RC2 may be smaller than a second thickness TH2 of the first interlayer insulating film ILD1 outside of the first recess pattern RC1 and the second recess pattern RC2 (e.g., an unexposed area). Although the invention is not limited thereto, the first thickness TH1 may be about 0.68 micrometer (μm), in a range of about 0.5 μm to about 0.9 μm, or in a range of about 0.2 μm to about 1.2 micrometers (μm). The second thickness TH2 may be about 1.17 μm, in a range of about 1.0 μm to about 1.4 μm, or in a range of about 0.9 μm to about 1.5 μm.

Detailed descriptions of the first recess pattern RC1 and the second recess pattern RC2 will be described later.

The oxide semiconductor layer 135 may be disposed on the first interlayer insulating film ILD1. The oxide semiconductor layer 135 may be disposed in the oxide transistor region AR2. The oxide semiconductor layer 135 may be formed of an oxide semiconductor (e.g., oxide semiconductor material). The oxide may include at least one oxide selected from I-G-Z-O, zinc (Zn) oxide, indium (In) oxide, gallium (Ga) oxide, tin (Sn) oxide, cadmium (Cd) oxide, germanium (Ge) oxide, and hafnium (Hf) oxide, or a combination thereof. The oxide may include at least one of indium-gallium-zinc oxide ("IGZO"), zinc-tin oxide ("ZTO"), indium-tin oxide ("ITO"), and the like.

The oxide semiconductor layer 135 may include the channel region 135c disposed to overlap the second gate electrode 142 thereabove in the thickness direction, and a source/drain region 135a (e.g., third region) and a second source/drain region 135b (e.g., fourth region) of the oxide semiconductor layer 135 respectively positioned on one side and the other side of the channel region 135c. The first and second source/drain regions 135a and 135b of the oxide semiconductor layer 135 are conductive regions, which may have higher conductivity and lower electrical resistance than the channel region 135c.

The oxide semiconductor layer 135 may include the semiconductor layers of the third transistor T3, the fourth transistor T4, and the seventh transistor T7 described above, and may form a channel of the corresponding transistor. In other words, the oxide semiconductor layer 135 may include the channel region 135c, the first source/drain region 135a, and the second source/drain region 135b of each of the third transistor T3, the fourth transistor T4, and the seventh transistor T7 described above. The channel region 135c is in a different layer than the channel region 105c.

The oxide semiconductor layer 135 may include a first through-hole HLE1. The first through-hole HLE1 may be defined by the oxide semiconductor layer 135. The first through-hole HLE1 may pass through the oxide semiconductor layer 135 in the thickness direction. The first through-hole HLE1 may be disposed corresponding to each of the first and second source/drain regions 135a and 135b of the oxide semiconductor layer 135 (e.g., first through-holes HLE1). In this case, the first through-hole HLE1 may expose side surfaces of the oxide semiconductor layer 135 at the first and second source/drain regions 135a and 135b, and the side surfaces of the oxide semiconductor layer 135 may define the first through-hole HLE1.

At least a part of the first source/drain electrode 153 and the second source/drain electrode 154 of the transistor disposed in the oxide transistor region AR2 may be disposed in the first through-hole HLE1. In other words, the first source/drain electrode 153 and the second source/drain electrode 154 of the transistor disposed in the oxide transistor region AR2 may be disposed along an inner wall of the first through-hole HLE1 defining the first through-holes HLE1. Accordingly, the first source/drain electrode 153 of the transistor disposed in the oxide transistor region AR2 may be in contact with the oxide semiconductor layer 135 (or the first source/drain region 135a of the oxide semiconductor layer 135) such that the first source/drain electrode 153 and the oxide semiconductor layer 135 (or the first source/drain region 135a of the oxide semiconductor layer 135) may be physically and/or electrically connected to each other. In addition, the second source/drain electrode 154 of the transistor disposed in the oxide transistor region AR2 may be in contact with the oxide semiconductor layer 135 (or the second source/drain region 135b of the oxide semiconductor layer 135) such that the second source/drain electrode 154 and the oxide semiconductor layer 135 (or the second source/drain region 135b of the oxide semiconductor layer 135) may be physically and/or electrically connected to each other.

Each of the first source/drain electrode 153 and the second source/drain electrode 154 of the transistor disposed in the oxide transistor region AR2 may be in direct contact with the inner wall of the first through-hole HLE1 (or a side surface of the oxide semiconductor layer 135 defining the first through-hole HLE1). As being in direct contact, elements may form an interface therebetween.

The first through-hole HLE1 may define a part of the first recess pattern RC1 and the second recess pattern RC2. In an embodiment of providing a display panel 10, the first through-hole HLE1 may be formed together while forming the first recess pattern RC1 and the second recess pattern RC2. Detailed descriptions of the first recess pattern RC1 and the second recess pattern RC2 will be described later.

Even though each of the first source/drain electrode 153 and the second source/drain electrode 154 of the transistor disposed in the oxide transistor region AR2 contacts extends along the inner wall at the first through-hole HLE1 to contact the oxide semiconductor layer 135, the transistor disposed in the oxide transistor region AR2 may operate smoothly.

Figure 7:
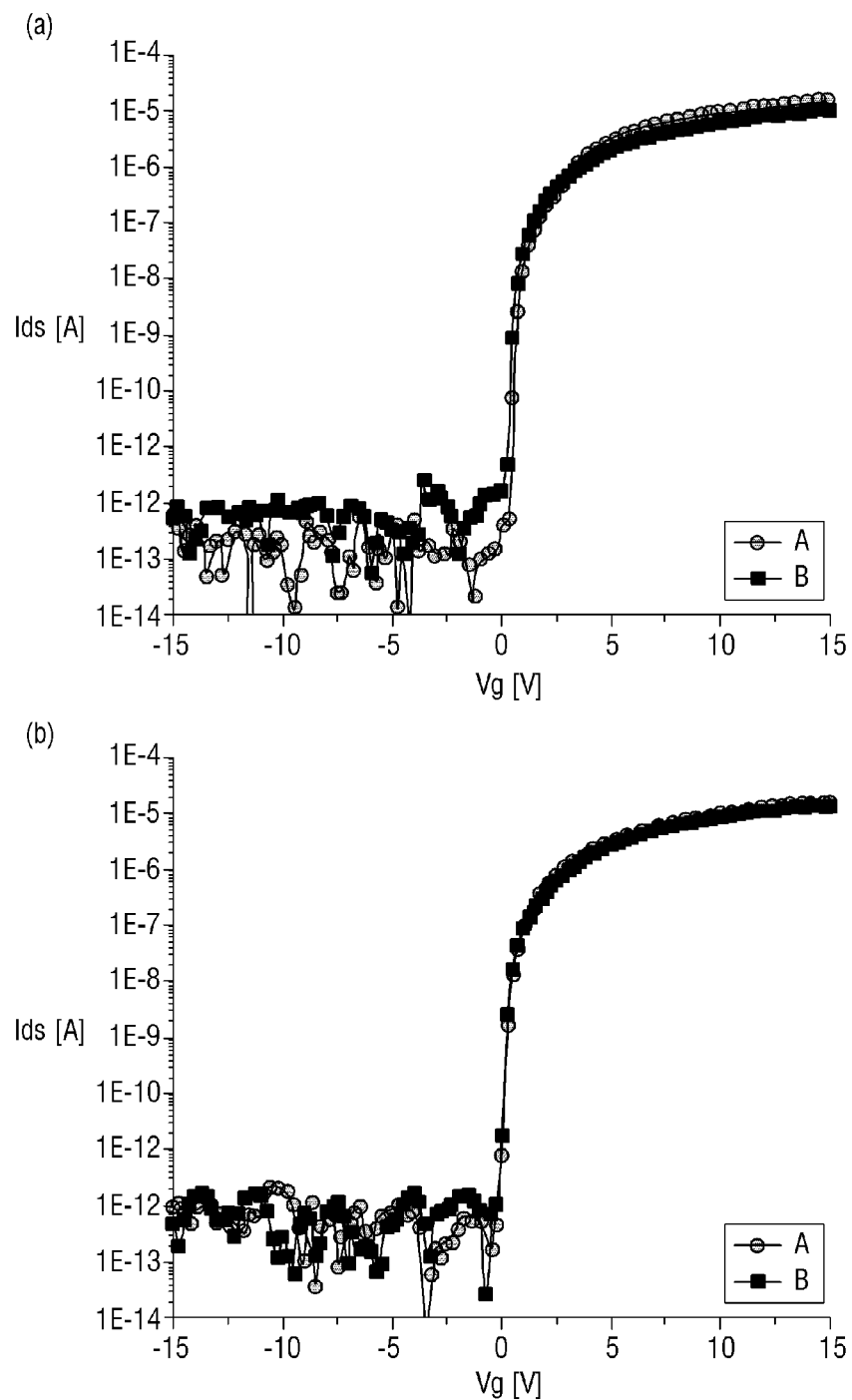
FIG. 7 is a graph of a driving current according to a gate voltage of an embodiment of a transistor in an oxide transistor region.

FIG. 7 is a graph of an electrical driving current according to a gate voltage of an embodiment of a transistor disposed in an oxide transistor region.

Referring to FIG. 7, the graph (a) shows a driving current Ids (in ampere, A) according to a gate voltage Vg (in volts, V) of the transistor disposed in the oxide transistor region in the display panel 10 which is formed at a center portion of a mother substrate. The graph (b) shows the driving current Ids according to the gate voltage Vg of the transistor disposed in the oxide transistor region in the display panel 10 which is formed near an edge of the mother substrate.

In the graph (a) and the graph (b), case A is a case that each of the first source/drain electrode 153 and the second source/drain electrode 154 of the transistor disposed in the oxide transistor region AR2 is in contact with each of the first source/drain region 135a and the second source/drain region 135b of the oxide semiconductor layer 135 by a contact hole (e.g., by a top surface of the oxide semiconductor layer 135). That is, the contact hole may expose the first source/drain region 135a and the second source/drain region 135b of the oxide semiconductor layer 135, and may not pass through the oxide semiconductor layer 135. In this case, the oxide semiconductor layer 135 may not include the first through-hole HLE1. As an embodiment of the invention, case B is a case that each of the first source/drain electrode 153 and the second source/drain electrode 154 of the transistor disposed in the oxide transistor region AR2 is in contact with each of the first source/drain region 135a and the second source/drain region 135b of the oxide semiconductor layer 135 by a side surface of the oxide semiconductor layer 135 exposed by the first through-hole HLE1.

Looking at the graphs (a) and (b), in the cases A and B, as the gate voltage Vg of the transistor disposed in the oxide transistor region AR2 changes, the driving current Ids changes, and the transistor may have a threshold voltage Vth at about 0.24 V. The case B in which the first source/drain electrode 153 and the second source/drain electrode 154 of the transistor disposed in the oxide transistor region AR2 are in contact with the first source/drain region 135a and the second source/drain region 135b of the oxide semiconductor layer 135 through the first through-hole HLE1, respectively, may have device characteristics similar to the case A that contacts through the contact holes CNT1 and CNT2.

In other words, even though the first source/drain electrode 153 and the second source/drain electrode 154 of the transistor disposed in the oxide transistor region AR2 are in contact with the first source/drain region 135a and the second source/drain region 135b of the oxide semiconductor layer 135 through the first through-hole HLE1, respectively, it is easy to adjust the turn-on and turn-off of the corresponding transistor, thereby ensuring the reliability of the device.

Therefore, when the first and second recess patterns RC1 and RC2 and the contact holes CNT1 and CNT2 are formed by one mask process, the number of mask processes may be reduced, thereby improving process efficiency and reducing process costs. In addition, even though the first and second recess patterns RC1 and RC2 and the contact holes CNT1 and CNT2 are formed by one mask process, the device characteristics of the transistor disposed in the oxide transistor region AR2 may be maintained.

In addition, in the graphs (a) and (b), the device characteristics of the transistor disposed in the oxide transistor region AR2 are similar. Therefore, when the oxide semiconductor layer 135 includes the first through-hole HLE1 and is in contact with the first source/drain electrode 153 and the second source/drain electrode 154 through the first through-hole HLE1, the device characteristics of the transistor disposed in the oxide transistor region AR2 may be maintained regardless of a position of the mother substrate.

In an embodiment of providing a display device 1, stacked structures (e.g., layers in the oxide transistor region AR2) of multiple display panels may be provided on a single mother substrate. As described above, the stacked structures may be at different positions along the mother substrate, such as at a center portion and at an edge portion of the mother substrate. The mother substrate may be divided into individual display cells each corresponding to a display panel 10, without being limited thereto.

Referring again to FIGS. 4 to 6, the third gate insulating film GI3 is disposed on the oxide semiconductor layer 135.

The third gate insulating film GI3 may include a second through-hole HLE2. The second through-hole HLE2 may be defined by the third gate insulating film GI3. The second through-hole HLE2 may pass through the third gate insulating film GI3 in the thickness direction. The second through-hole HLE2 may overlap the first and second source/drain regions 135a and 135b of the oxide semiconductor layer 135. The second through-hole HLE2 may overlap the first through-hole HLE1 to be aligned with the first through-hole HLE1.

That is, the third gate insulating film GI3 may cover not only an upper surface of the oxide semiconductor layer 135 excluding portions in which the contact holes CNT1 and CNT2 and the first and second recess patterns RC1 and RC2 are formed but also a side surface of the oxide semiconductor layer 135. The third gate insulating film GI3 may be disposed generally over the entire surface of the first interlayer insulating film ILD1.

The second through-hole HLE2 may define a part of the first recess pattern RC1 and the second recess pattern RC2, and the second through-hole HLE2 may be formed together while forming the first recess pattern RC1 and the second recess pattern RC2.

The third gate insulating film GI3 may contain a silicon compound, a metal oxide, or the like. In an embodiment, for example, the third gate insulating film GI3 may contain silicon oxide, silicon nitride, silicon oxynitride, aluminum oxide, tantalum oxide, hafnium oxide, zirconium oxide, titanium oxide, or the like. These may be used alone or in combination with each other.

The third conductive layer 140 is disposed on the third gate insulating film GI3. The third conductive layer 140 is a gate conductive layer and may include the second gate electrode 142 of the transistor disposed in the oxide transistor region AR2. The third conductive layer 140 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second interlayer insulating film ILD2 is disposed on the third conductive layer 140. The second interlayer insulating film ILD2 may include a third through-hole HLE3. The third through-hole HLE3 may be defined by the second interlayer insulating film ILD2. The third through-hole HLE3 may pass through the second interlayer insulating film ILD2 in the thickness direction. The third through-hole HLE3 may overlap the first and second source/drain regions 135a and 135b of the oxide semiconductor layer 135. The third through-hole HLE3 may overlap the first through-hole HLE1 and the second through-hole HLE2 to be aligned therewith. In an embodiment a through-hole (e.g., the first recess pattern RC1 or the second recess pattern RC2) includes the first through-hole HLE1 together with the second through-hole HLE2 (and the third through-hole HLE3) is provided in plural including a plurality of through-holes (e.g., the first recess pattern RC1 and the second recess pattern RC2).

The third through-hole HLE3 may define a part of the first recess pattern RC1 and the second recess pattern RC2, and the third through-hole HLE3 may be formed together while forming the first recess pattern RC1 and the second recess pattern RC2.

The second interlayer insulating film ILD2 may contain a silicon compound, a metal oxide, or the like. In an embodiment, for example, the second interlayer insulating film ILD2 may contain silicon oxide, silicon nitride, silicon oxynitride, aluminum oxide, tantalum oxide, hafnium oxide, zirconium oxide, titanium oxide, or the like. These may be used alone or in combination with each other.

The fourth conductive layer 150 is disposed on the second interlayer insulating film ILD2. The fourth conductive layer 150 may contain at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth conductive layer 150 is a data conductive layer, and may include the first source/drain electrode 151 and the second source/drain electrode 152 of the transistor disposed in the silicon transistor region AR1, and the first source/drain electrode 153 and the second source/drain electrode 154 of the transistor disposed in the oxide transistor region AR2.

In the transistor disposed in the silicon transistor region AR1, the first source/drain electrode 151 may pass through the second interlayer insulating film ILD2, the second gate insulating film GI2, and the first gate insulating film GI1 to be connected to the first source/drain region 105a of the silicon semiconductor layer 105 through the contact hole CNT1 exposing the first source/drain region 105a of the silicon semiconductor layer 105 to outside the contact hole CNT1. The second source/drain electrode 152 may pass through the second interlayer insulating film ILD2, the second gate insulating film GI2, and the first gate insulating film GI1 to be connected to the second source/drain region 105b of the silicon semiconductor layer 105 through the contact hole CNT2 exposing the second source/drain region 105b of the silicon semiconductor layer 105 to outside the contact hole CNT2.

The display panel 10 may further include the first recess pattern RC1 and the second recess pattern RC2. The first and second recess patterns RC1 and RC2 may be defined by removing at least a part of the second interlayer insulating film ILD2, the third gate insulating film GI3, the oxide semiconductor layer 135, and the first interlayer insulating film ILD1.

Although not limited thereto, the first recess pattern RC1 and the second recess pattern RC2 may pass through the second interlayer insulating film ILD2, the third gate insulating film GI3, and the oxide semiconductor layer 135 in the thickness direction, and may be defined by removing an upper portion of the first interlayer insulating film ILD1 to provide the first recess and the second recess. In this case, sidewalls of the first recess pattern RC1 and the second recess pattern RC2 may be formed by sidewalls of the second interlayer insulating film ILD2, the third gate insulating film GI3, the oxide semiconductor layer 135, and the first interlayer insulating film ILD1, together with bottom surfaces of the first interlayer insulating film ILD1 defined by the first and second recesses. In FIG. 5, for example, a top surface of the first interlayer insulating film ILD1 is furthest from the substrate 101, a rear surface opposing the top surface is closest to the substrate 101, and the bottom surfaces are between the top surface and the rear surface along the thickness of the display panel 10.

In this case, each of the first recess pattern RC1 and the second recess pattern RC2 may include the first through-hole HLE1 of the oxide semiconductor layer 135, the second through-hole HLE2 of the third gate insulating film GI3, and the third through-hole HLE3 of the second interlayer insulating film ILD2. In other words, each of the sidewall of the first recess pattern RC1 defining the first recess pattern RC1 and the sidewall of the second recess pattern RC2 defining the second recess pattern RC2 may include an inner wall of the oxide semiconductor layer 135 at the through-hole HLE1, an inner wall of the third gate insulating film GI3 at the second through-hole HLE2, and an inner wall of second interlayer insulating film ILD2 at the third through-hole HLE3.

In the transistor disposed in the oxide transistor region AR2, the first source/drain electrode 153 may be physically and/or electrically connected to the first source/drain region 135a of the oxide semiconductor layer 135 through the first recess pattern RC1. The second source/drain electrode 154 may be physically and/or electrically connected to the second source/drain region 135b of the oxide semiconductor layer 135 through the second recess pattern RC2.

In other words, in the transistor disposed in the oxide transistor region AR2, each of the first source/drain electrode 153 and the second source/drain electrode 154 may be disposed along side surfaces and bottom surfaces respectively defining each of the first recess pattern RC1 and the second recess pattern RC2. The first source/drain electrode 153 may be disposed on the inner wall of the first through-hole HLE1, the inner wall of the second through-hole HLE2, and the inner wall of the third through-hole HLE3, which define the first recess pattern RC1 and the second recess pattern RC2, and on side and bottom surfaces defined by the first interlayer insulating film ILD1. In this case, the first source/drain electrode 153 may be in contact with the first source/drain region 135a of the oxide semiconductor layer 135, and the first source/drain electrode 153 may be physically and/or electrically connected to the first source/drain region 135a of the oxide semiconductor layer 135.

Although the invention is not limited thereto, the first recess pattern RC1 and the second recess pattern RC2 may not overlap the lower light blocking pattern 122. That is, the first recess pattern RC1 and the second recess pattern RC2 are spaced apart from the lower light blocking pattern 122 in a direction along the substrate 101. Accordingly, even though the first recess pattern RC1 and the second recess pattern RC2 are defined by removing at least a part of the first interlayer insulating film ILD1, since the first interlayer insulating film ILD1 extends between the first source/drain electrode 153 and the second source/drain electrode 154 of the transistor disposed in the oxide transistor region AR2, and the lower light blocking pattern 122, the first source/drain electrode 153 and the second source/drain electrode 154 of the transistor disposed in the oxide transistor region AR2 may be electrically insulated from the lower light blocking pattern 122.

The first recess pattern RC1 and the second recess pattern RC2 may be formed together with the contact holes CNT1 and CNT2 by one mask process. In this case, a separate mask process for forming the first and second recess patterns RC1 and RC2 is not required, and thus process efficiency may be improved and process costs may be reduced. A detailed description of this will be described later.

The first via layer VIA1 is disposed on the fourth conductive layer 150. The first via layer VIA1 may contain an inorganic insulating material or an organic insulating material such as polyacrylate resin, epoxy resin, phenolic resin, polyamide resin, polyimide rein, unsaturated polyester resin, polyphenylenether resin, polyphenylenesulfide resin, or benzocyclobutene ("BCB").

The first via layer VIA1 may be disposed on the second interlayer insulating film ILD2 to completely cover an upper surface of the second interlayer insulating film ILD2. When the first via layer VIA1 is formed of an organic material film, its upper surface may be flat despite a step thereunder.

The fifth conductive layer 160 is disposed on the first via layer VIAL The fifth conductive layer 160 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fifth conductive layer 160 may include an anode connection electrode 161. A contact hole CNT3 (e.g., third contact hole) exposing the second source/drain electrode 152 of the transistor disposed in the silicon transistor region AR1 to outside the first via layer VIA1 may be defined in the first via layer VIA1, and the anode connection electrode 161 may be connected to the second source/drain electrode 152 through the contact hole CNT3.

The second via layer VIA2 is disposed on the anode connection electrode 161. The second via layer VIA2 may contain an inorganic insulating material or an organic insulating material such as polyacrylate resin, epoxy resin, phenolic resin, polyamide resin, polyimide rein, unsaturated polyester resin, polyphenylenether resin, polyphenylenesulfide resin, or benzocyclobutene ("BCB").

The anode ANO of a light-emitting element is disposed on the second via layer VIA2. The anode ANO may be a pixel electrode that is separately disposed for each pixel. The anode ANO may pass through the second via layer VIA2, and may be electrically connected to the anode connection electrode 161 through a contact hole CNT4 (e.g., fourth contact hole) exposing a part of the anode connection electrode 161 to outside the second via layer VIA2.

The anode ANO is not limited thereto, but may have a stacked film structure in which a material layer having a high work function such as indium-tin-oxide (ITO), indium-zinc-oxide (IZO), zinc oxide (ZnO), or indium oxide ($In_2O_3$) and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a combination thereof are stacked.

The layer of the anode ANO having a high work function may be disposed above the reflective material layer to be disposed closer to an emission layer EL of the light-emitting element. The anode ANO may have a multilayer structure of ITO/Mg, ITO/MgF, ITO/Ag, or ITO/Ag/ITO, but the present disclosure is not limited thereto.

The pixel defining film PDL may be disposed on the anode ANO. The pixel defining film PDL may include an opening partially exposing the anode ANO to outside the pixel defining film PDL. The pixel defining film PDL may be made of an organic insulating material or an inorganic insulating material. In an embodiment, for example, the pixel defining film PDL may contain at least one of polyamide resin, acrylate resin, a silicone compound, and polyacrylate resin.

The emission layer EL is disposed on the anode ANO exposed by the pixel defining film PDL. The emission layer EL may contain an organic material layer. The organic material layer of the emission layer includes an organic emission layer, and may further include a hole injection/transport layer and/or an electron injection/transport layer.

A cathode CAT may be disposed on the emission layer EL. The cathode CAT may be a common electrode disposed entirely without distinction between the pixels.

The cathode CAT may include a material layer having a low work function such as Li, Ca, LiF/Ca, LiF/Al, Al, Mg, Ag, Pt, Pd, Ni, Au, Nd, Ir, Cr, BaF, Ba, or a compound or combination thereof (e.g., a combination of Ag and Mg, etc.). The cathode CAT may further include a transparent metal oxide layer disposed on the material layer having a low work function.

The anode ANO, the emission layer EL, and the cathode CAT may together constitute an organic light-emitting device as a light-emitting element.

A thin film encapsulation layer 170 including a first inorganic film 171, an organic film 172, and a second inorganic film 173 in order is disposed on the cathode CAT. The first inorganic film 171 and the second inorganic film 173 may be in contact with each other at an end portion of the thin film encapsulation layer 170. The organic film 172 may be sealed by the first inorganic film 171 and the second inorganic film 173 which are in contact with each other at the end portion of the thin film encapsulation layer 170.

The first inorganic film 171 and the second inorganic film 173 may each contain silicon nitride, silicon oxide, or silicon oxynitride. The organic film 172 may contain an organic insulating material.

Hereinafter, the non-display area NDA will be described.

In the non-display area NDA of the display panel 10, the substrate 101, the barrier layer 102, the buffer layer 103, the first gate insulating film GI1, the second gate insulating film GI2, and the first interlayer insulating film ILD1, the third gate insulating film GI3, the second interlayer insulating film ILD2, the first via layer VIA1, a connection wiring of the fifth conductive layer 160, the second via layer VIA2, and the pixel defining film PDL may be disposed sequentially.

The non-display area NDA may include the bending area BA. The bending area BA may include a first bending opening OP1 and a second bending opening OP2 (e.g., bending openings OP1 and OP2) which are formed by partially removing one or more insulating films and exposing the substrate 101 to outside the bending openings OP1 and OP2. The first bending opening OP1 and the second bending opening OP2 may together define a bending opening in the bending area BA. Specifically, the bending openings OP1 and OP2 may be formed at a portion in which the barrier layer 102, the buffer layer 103, the first gate insulating film GI1, the second gate insulating film GI2, the first interlayer insulating film ILD1, and the second interlayer insulating film ILD2 overlap each other within the bending area BA. Each of the bending openings OP1 and OP2 may be defined by sidewalls of the insulating films from which portions thereof are partially removed. That is, each of the barrier layer 102, the buffer layer 103, the first gate insulating film GI1, the second gate insulating film GI2, the first interlayer insulating film ILD1, and the second interlayer insulating film ILD2 have a sidewall in the bending area BA which forms a part of a bending opening.

Taking FIG. 1 and FIG. 4 together, the first bending opening OP1 and the second bending opening OP2 are formed to cross the bending area BA in a width direction, that is, in the first direction DR1. The bending opening may have a width along the second direction DR2 and a depth along the third direction DR3.

Each of the first bending opening OP1 and the second bending opening OP2 may have opposing edges along the first direction DR1 and opposing edges along the second direction DR2. The opposing edges may define a maximum dimension of a respective bending opening along the first direction DR1 and along the second direction DR2. In a plan view, the first bending opening OP1 is disposed around the second bending opening OP2. That is, an edge of the first bending opening OP1 is disposed outside an edge of the second bending opening OP2. In the plan view, the second bending opening OP2 may be positioned in the first bending opening OP1.

Referring to FIG. 4, for example, a width of the first bending opening OP1 (e.g., a width in the second direction DR2) may be larger than a width of the second bending opening OP2 (e.g., a width in the second direction DR2). As including the first bending opening OP1 and the second bending opening OP2, it is possible to reduce or effectively prevent bending stress that may occur when the above-described display device 1 is bent at the bending area BA.

The first bending opening OP1 is defined extended through the second interlayer insulating film ILD2, the third gate insulating film GI3, the first interlayer insulating film ILD1, the second gate insulating film GI2, and the first gate insulating film GI1 in the thickness direction. The first bending opening OP1 may expose the buffer layer 103 to outside the first bending opening OP1. The second bending opening OP2 is formed extended through the buffer layer 103 and the barrier layer 102 exposed outside of the first bending opening OP1 at the first bending opening OP1.

A space (or volume) vacated by the first bending opening OP1 and the second bending opening OP2 may be filled with the first via layer VIA1 in the bending area BA. The second via layer VIA2 and the pixel defining film PDL may be disposed on the first via layer VIA1 in the bending area BA. In an embodiment, at least one of the second via layer VIA2 and the pixel defining film PDL may be omitted in the non-display area NDA.

Hereinafter, an embodiment of a method of manufacturing or providing a display device 1 will be described.

Figure 8:
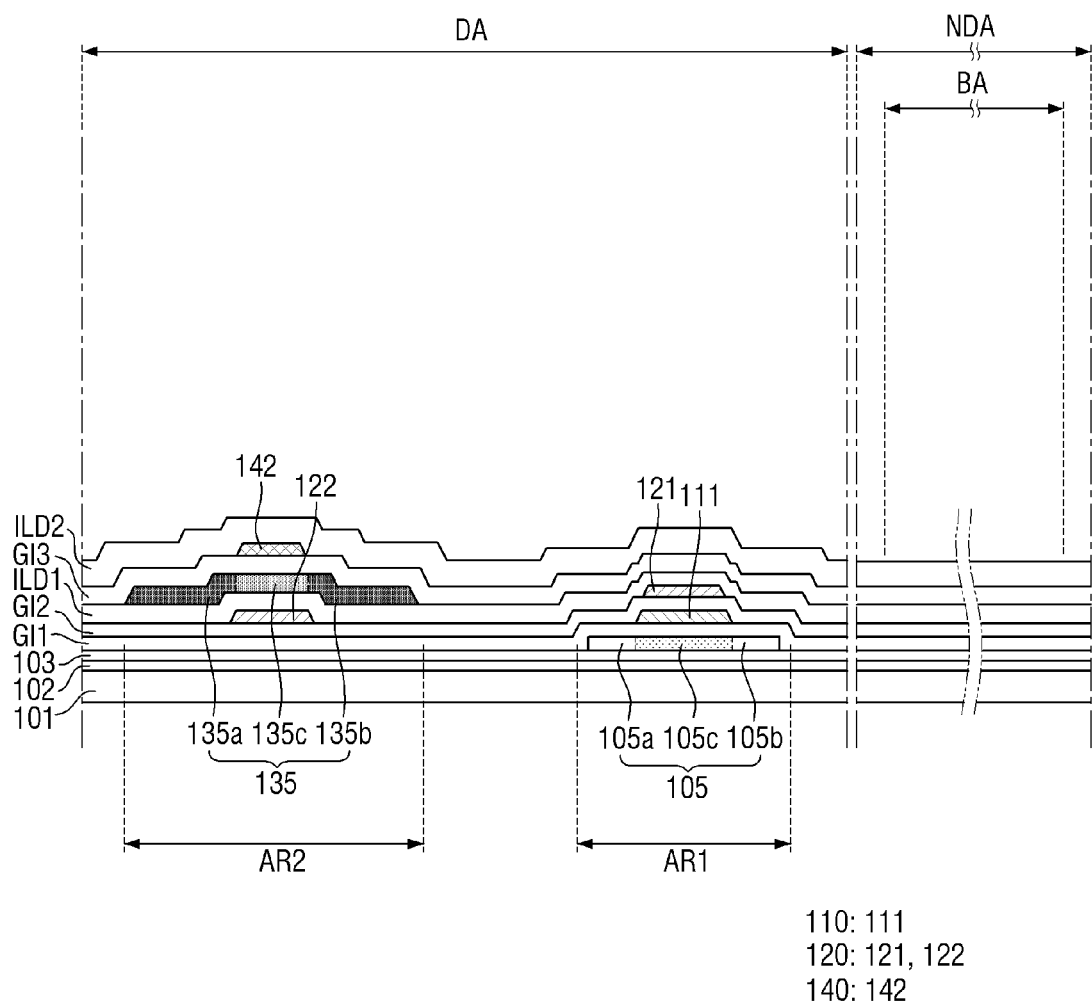
FIGS. 8 to 12 are cross-sectional views of an embodiment of a method of providing the display device.
Figure 9:
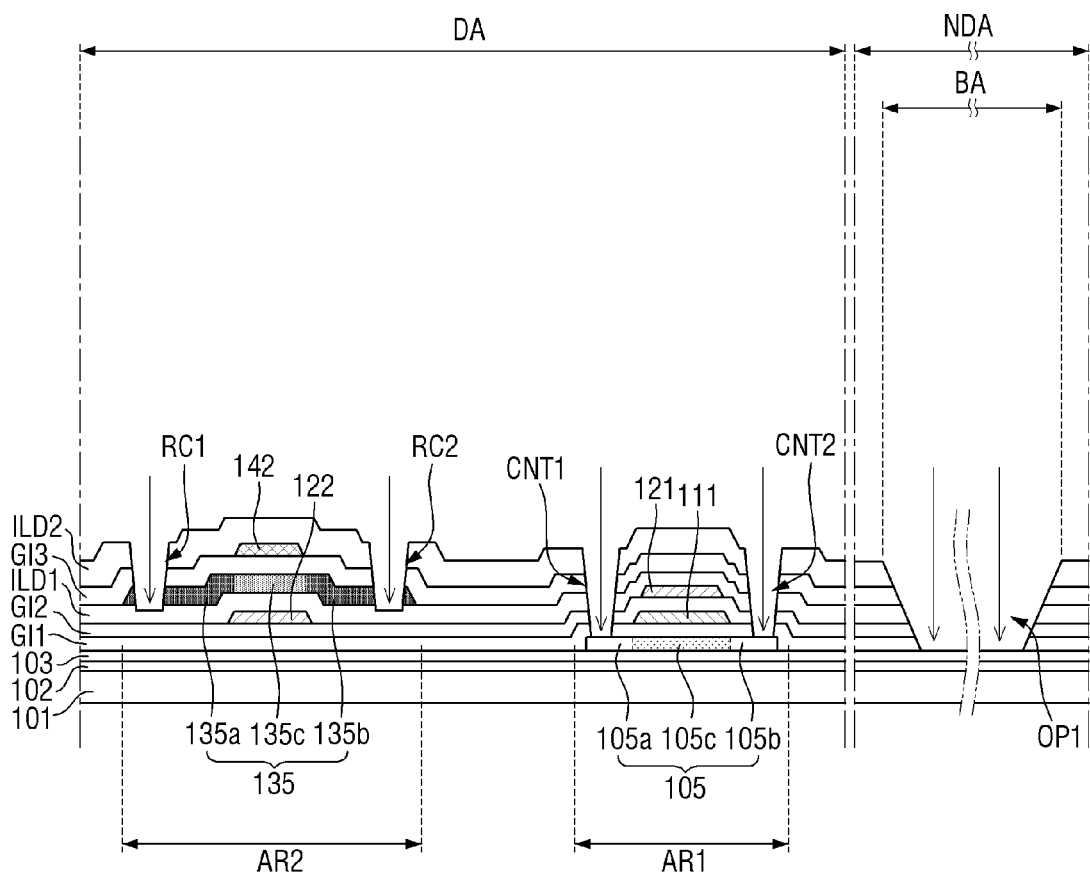
Figure 10:
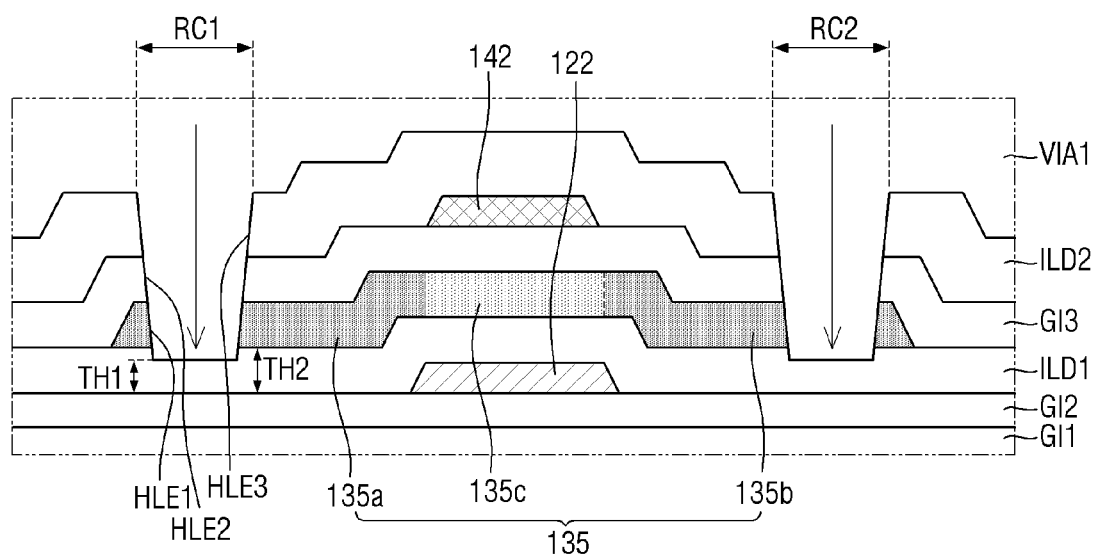

FIGS. 8 to 12 are cross-sectional views of processes in an embodiment of a method of providing the display device 1. FIG. 10 is an enlarged cross-sectional view of a partial region of FIG. 9.

Referring to FIG. 8, a display area DA including a silicon transistor region AR1 and an oxide transistor region AR2, and a non-display area NDA which is adjacent to the display area DA are defined. A substrate 101 on which a silicon semiconductor layer 105 is disposed in the transistor region AR1 is prepared or provided.

A barrier layer 102 and a buffer layer 103 are sequentially stacked on the substrate 101, and a material layer for the silicon semiconductor layer 105 is formed on the buffer layer 103. The silicon semiconductor layer 105 as shown in FIG. 8 may be formed by patterning the material layer through a photolithography process.

A first gate insulating film GI1 is formed on the entire surface of the buffer layer 103 on which the silicon semiconductor layer 105 is formed. A first gate electrode 111 is formed on the first gate insulating film GI1. The first gate electrode 111 may be formed as shown in FIG. 8 by blanket-depositing a material layer for a first conductive layer 110 on the first gate insulating film GI1 and then patterning the material layer through a photolithography process.

A second gate insulating film GI2 is formed on the entire surface of the first gate insulating film GI1 on which the first gate electrode 111 is formed. A second electrode 121 of a capacitor Cst is formed on the second gate insulating film GI2. The second electrode 121 of the capacitor Cst may be formed as shown in FIG. 8 by blanket-depositing a material layer for a second conductive layer 120 and then patterning the material layer through a photolithography process.

A first interlayer insulating film ILD1 is formed on the entire surface of the second gate insulating film GI2 on which the second electrode 121 of the capacitor Cst is formed. An oxide semiconductor layer 135 is formed on the first interlayer insulating film ILD1. The oxide semiconductor layer 135 may be formed as shown in FIG. 8 by blanket-depositing a material layer for an oxide semiconductor layer 135 and then patterning the material layer through a photolithography process.

A third gate insulating film GI3 is formed on the entire surface of the first interlayer insulating film ILD1 on which the oxide semiconductor layer 135 is formed. A second gate electrode 142 is formed on the third gate insulating film GI3. The second gate electrode 142 may be formed as shown in FIG. 8 by blanket-depositing a material layer for a third conductive layer 140 and then patterning the material layer through a photolithography process.

A second interlayer insulating film ILD2 is formed on the entire surface of the third gate insulating film GI3 on which the second gate electrode 142 is formed.

Each of the second interlayer insulating film ILD2, the third gate insulating film GI3, the first interlayer insulating film ILD1, the second gate insulating film GI2, the first gate insulating film GIL the buffer layer 103, the barrier layer 102 and the substrate 101 may be in the display area DA and in the non-display area NDA. One or more of these layers may be in the bending area BA of the non-display area NDA, without being limited thereto.

Referring to FIGS. 9 and 10, first and second recess patterns RC1 and RC2, contact holes CNT1 and CNT2, and a first bending opening OP1 are formed.

The contact holes CNT1 and CNT2, the first bending opening OP1, and the first and second recess patterns RC1 and RC2 may be formed by one mask process. That is, the contact holes CNT1 and CNT2, the first bending opening OP1, and the first and second recess patterns RC1 and RC2 may be simultaneously formed by the same mask.

In an embodiment, for example, a patterned photoresist pattern (not shown) is formed on the second interlayer insulating film ILD2, and the second interlayer insulating film ILD2, the third gate insulating film GI3, the oxide semiconductor layer 135, the first interlayer insulating film ILD1, the second gate insulating film GI2, and the first gate insulating film GI1 are etched (indicated by downward arrows in FIG. 10) using the patterned photoresist pattern as an etching mask. Thus, the contact holes CNT1 and CNT2 exposing the silicon semiconductor layer 105 in the display area DA to outside the second interlayer insulating film ILD2, the third gate insulating film GI3, the oxide semiconductor layer 135, the first interlayer insulating film ILD1, the second gate insulating film GI2, and the first gate insulating film GI1, and the first bending opening OP1 exposing the buffer layer 103 in the non-display area NDA to outside the same layers are simultaneously formed.

In addition, the first and second recess patterns RC1 and RC2 may be formed together while forming the contact holes CNT1 and CNT2 and the first bending opening OP1. That is, the first and second recess patterns RC1 and RC2 as shown in FIG. 8 may be formed by removing at least a part of the second interlayer insulating film ILD2, the third gate insulating film GI3, the oxide semiconductor layer 135, and the first interlayer insulating film ILD1 while forming the contact holes CNT1 and CNT2 and the first bending opening OP1 using the photoresist pattern as an etching mask. In an embodiment, for example, thickness portions of the second interlayer insulating film ILD2, the third gate insulating film GI3, and the oxide semiconductor layer 135 may be removed, and an upper portion of the first interlayer insulating film ILD1 may be removed while forming the first and second recess patterns RC1 and RC2.

That is, a first through-hole HLE1 of the oxide semiconductor layer 135, a second through-hole HLE2 of the third gate insulating film GI3, and a third through-hole HLE3 of the second interlayer insulating film ILD2 may be formed together while forming the first and second recess patterns RC1 and RC2.

In this case, the contact holes CNT1 and CNT2 at which the first and second source/drain electrodes 151 and 152 (see in FIG. 4) of the transistor disposed in the silicon transistor region AR1 contact with the first and second source/drain regions 105a and 105b of the silicon semiconductor layer 105, and the first and second recess patterns RC1 and RC2 at which the first and second source/drain electrodes 153 and 154 (see in FIG. 4) of the transistor disposed in the oxide transistor region AR2 contact with the first and second source/drain regions 135a and 135b of the oxide semiconductor layer 135 may be formed through one mask. Accordingly, a separate mask process for forming each of the contact holes CNT1 and CNT2 and each of the first and second recess patterns RC1 and RC2 is obviated, and thus the number of mask processes may be reduced. Further, process efficiency may be improved and process costs may be reduced.

Figure 11:
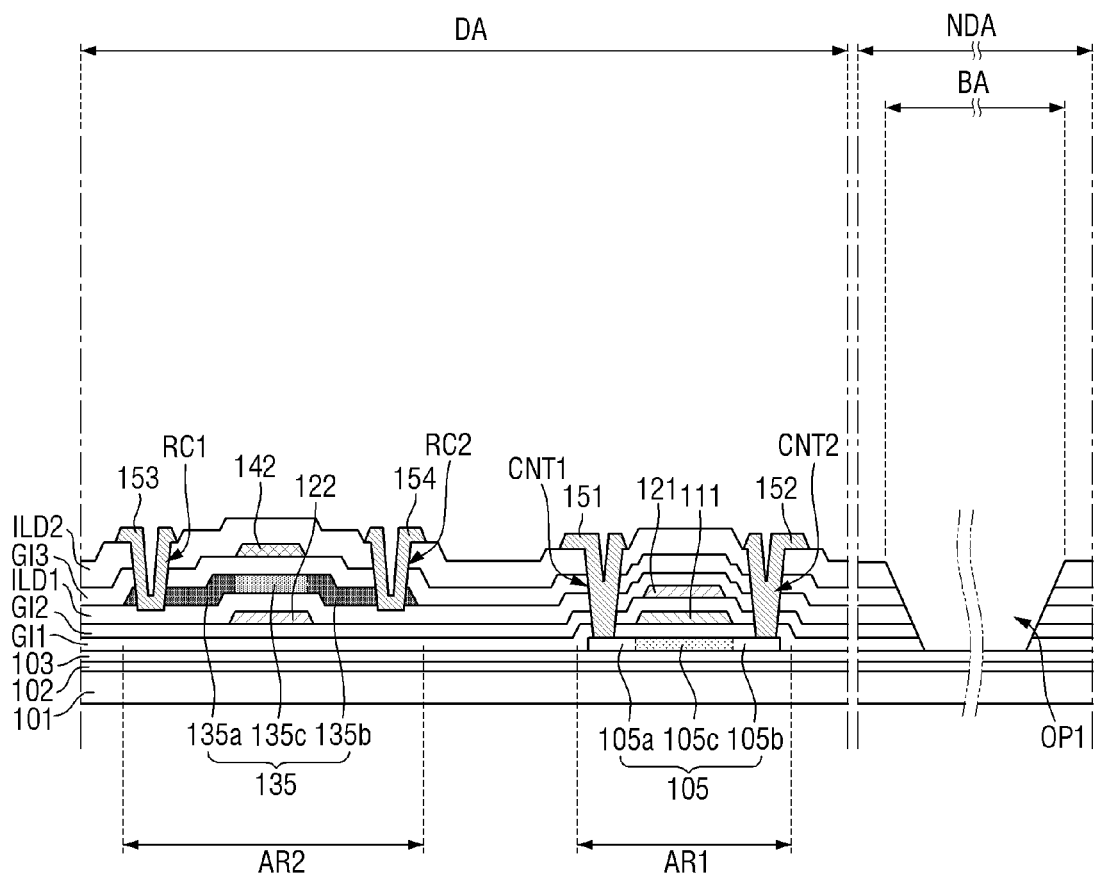

Referring to FIG. 11, a patterned fourth conductive layer 150 is formed on the second interlayer insulating film ILD2. The fourth conductive layer 150 may include the first and second source/drain electrodes 151 and 152 of the transistor disposed in the silicon transistor region AR1 and the first and second source/drain electrodes 153 and 154 of the transistor disposed in the oxide transistor region AR2.

The patterned fourth conductive layer 150 may be formed by the mask process. In an embodiment, for example, a material layer for the fourth conductive layer 150 is blanket-deposited on the second interlayer insulating film ILD2. In the deposition process, the material layer for the fourth conductive layer 150 may be deposited into the contact holes CNT1 and CNT2 and into the first and second recess patterns RC1 and RC2. Accordingly, the first and second source/drain electrodes 151 and 152 of the transistor disposed in the silicon transistor region AR1 and the first and second source/drain electrodes 153 and 154 of the transistor disposed in the oxide transistor region AR2 may be electrically connected to the silicon semiconductor layer 105 and the oxide semiconductor layer 135, respectively.

A photoresist layer is applied on the material layer for the fourth conductive layer 150, a photoresist pattern is formed by exposure and development, and then the material layer for the fourth conductive layer 150 is etched using the photoresist pattern as an etching mask. Thereafter, the photoresist pattern is removed through a strip or ashing process to complete the patterned fourth conductive layer 150 as shown in FIG. 11.

In this case, each of the first source/drain electrode 153 and the second source/drain electrode 154 of the transistor disposed in the oxide transistor region AR2 may be disposed along an inner surface of each layer defining the first recess pattern RC1 and the second recess pattern RC2. Accordingly, the first source/drain electrode 153 and the second source/drain electrode 154 of the transistor disposed in the oxide transistor region AR2 may be in contact with the first source/drain region 135a and the second source/drain region 135b of the oxide semiconductor layer 135, respectively, and the first source/drain electrode 153 and the second source/drain electrode 154, and the first source/drain region 135a and the second source/drain region 135b may be physically and/or electrically connected to each other.

Figure 12:
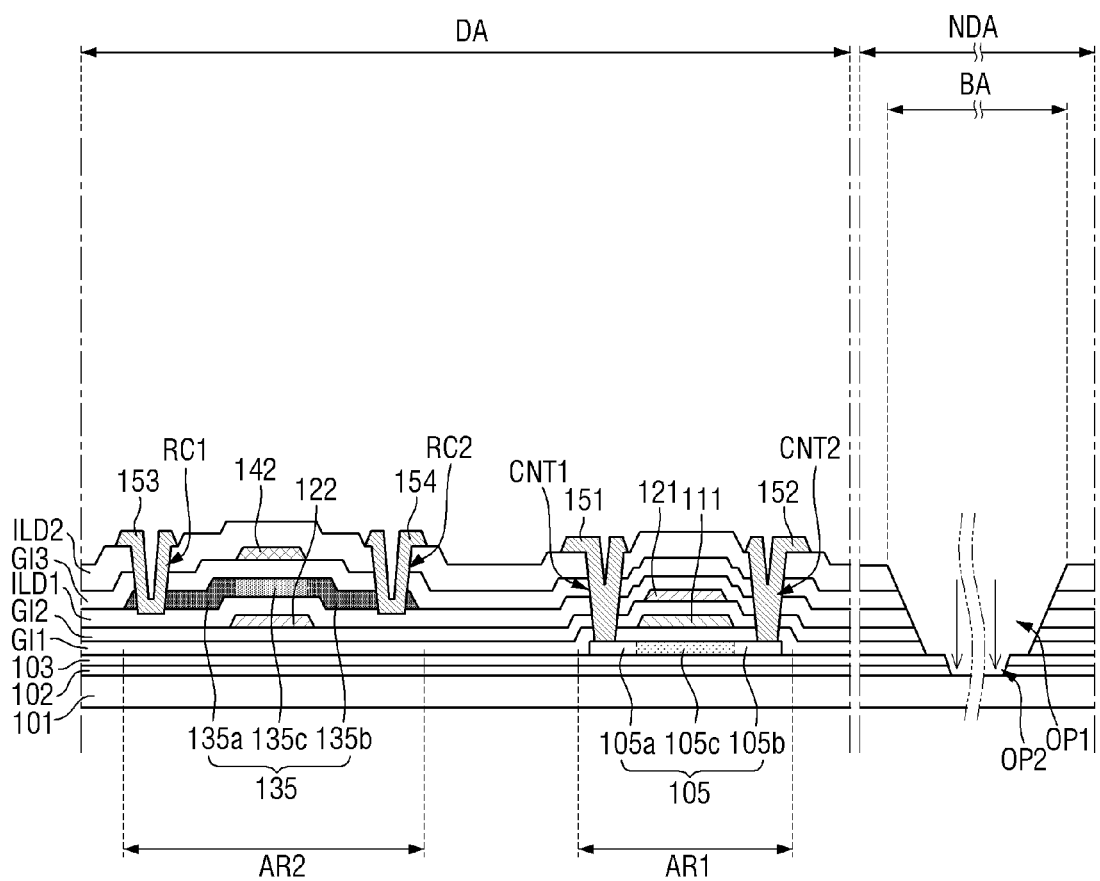

Referring to FIG. 12, a second bending opening OP2 is formed in the non-display area NDA. In the non-display area NDA, a patterned photoresist pattern (not shown) is formed on the buffer layer 103 exposed to outside the second interlayer insulating film ILD2, the third gate insulating film GI3, the oxide semiconductor layer 135, the first interlayer insulating film ILD1, the second gate insulating film GI2, and the first gate insulating film GI1 by the first bending opening OP1, and the buffer layer 103 and the barrier layer 102 are etched using the patterned photoresist pattern as an etching mask. Thus, the second bending opening OP2 exposing the substrate 101 to outside the second interlayer insulating film ILD2, the third gate insulating film GI3, the oxide semiconductor layer 135, the first interlayer insulating film ILD1, the second gate insulating film GI2, the first gate insulating film GI1, the buffer layer 103 and the barrier layer 102 may be formed in the non-display area NDA.

Hereinafter, embodiments of the invention will be described. In the following embodiment, the same components as those of the embodiments already described will be omitted or simplified, and differences therebetween will be mainly described.

Figure 13:
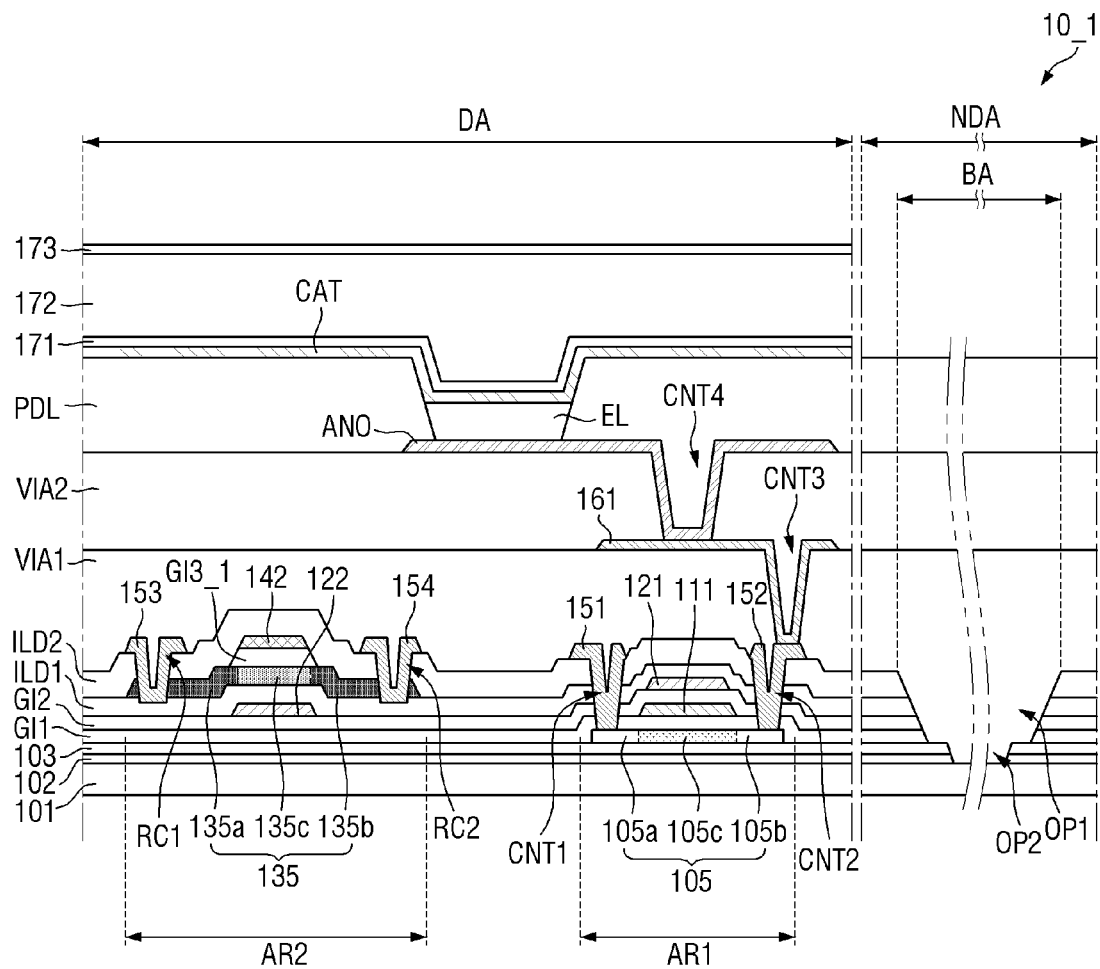
FIG. 13 is an enlarged cross-sectional view of an embodiment of a display panel.

FIG. 13 is an enlarged cross-sectional view of an embodiment of a display panel 10_1.

Referring to FIG. 13, a third gate insulating film GI3_1 of a display panel 10_1 is different from that of the embodiment of FIG. 4 in that the third gate insulating film GI3_1 of the display panel 10_1 may be a pattern (e.g., discrete member) within the oxide transistor region AR2.

Specifically, the third gate insulating film GI3_1 may be disposed on the oxide semiconductor layer 135, and the third gate insulating film GI3_1 may be disposed in only a partial region unlike the first gate insulating film GI1 and the second gate insulating film GI2. That is, the third gate insulating film GI3_1 may cover the channel region 135c of the oxide semiconductor layer 135, and may expose the first and second source/drain regions 135a and 135b and the side surfaces of the oxide semiconductor layer 135 to outside the third gate insulating film GI3_1. The third gate insulating film GI3_1 may have substantially the same pattern shape (e.g., planar shape) as the second gate electrode 142 thereabove in a plan view. The third gate insulating film GI3_1 may be patterned by etching a material layer for the third gate insulating film GI3_1 using the third conductive layer 140 as an etching mask, but the invention is not limited thereto.

In this case, each of the contact holes CNT1 and CNT2 and the first bending opening OP1 may pass through the second interlayer insulating film ILD2, the first interlayer insulating film ILD1, the second gate insulating film GI2, and the first gate insulating film GI1 in the thickness direction to expose each of the silicon semiconductor layer 105 and the buffer layer 103 to outside these layers. In addition, the first and second recess patterns RC1 and RC2 may pass through the second interlayer insulating film ILD2 and the oxide semiconductor layer 135 in the thickness direction, and may be defined by removing at least a part of the first interlayer insulating film ILD1.

Even in this case, since the first and second recess patterns RC1 and RC2 and the contact holes CNT1 and CNT2 may be formed by one mask process using a same mask, process efficiency may be improved and process costs may be reduced. In addition, a thickness of the display panel 10_1 may be reduced by disposing the third gate insulating film GI3_1 only in a partial region.

Figure 14:
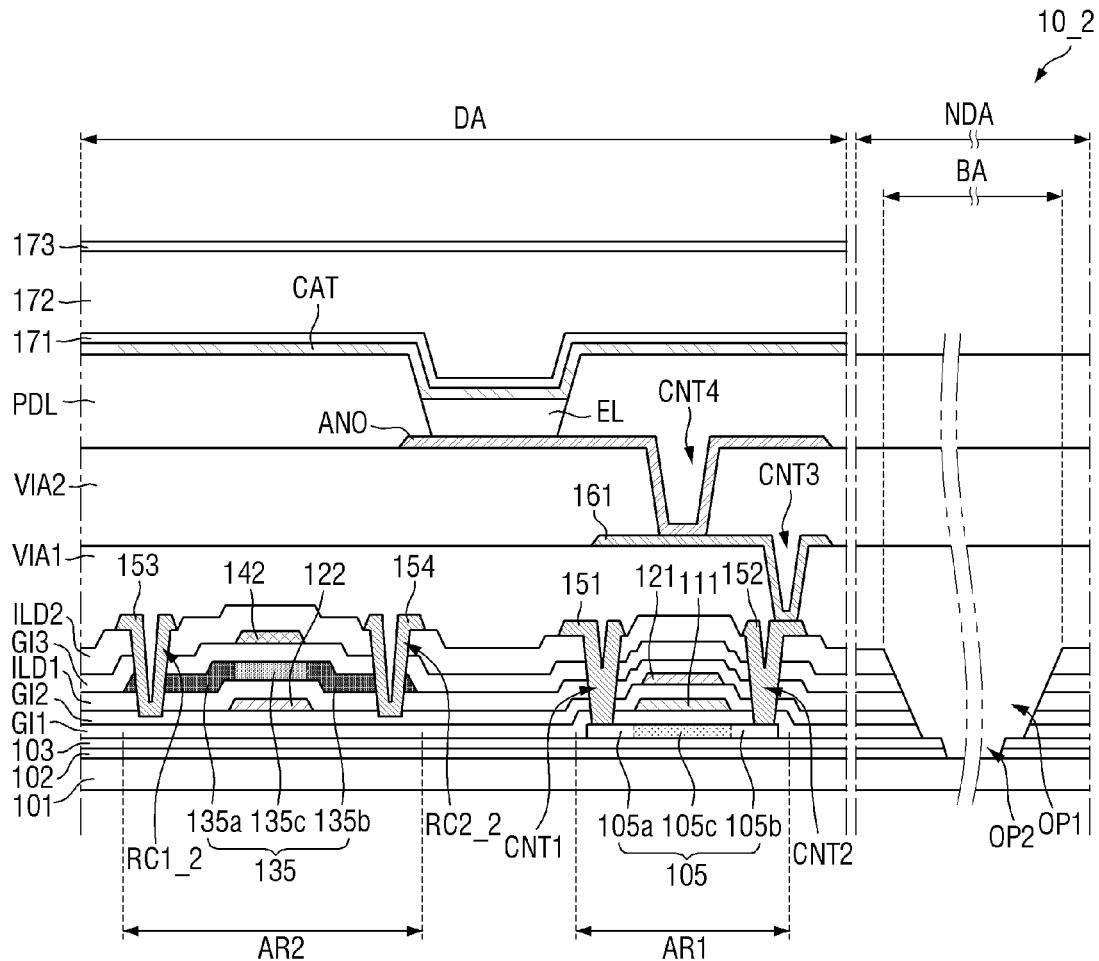
FIG. 14 is an enlarged cross-sectional view of an embodiment of a display panel.

FIG. 14 is an enlarged cross-sectional view of a display panel 10_2.

Referring to FIG. 14, first and second recess patterns RC1_2 and RC2_2 of a display panel 10_2 are defined by removing at least a part of the second interlayer insulating film ILD2, the third gate insulating film GI3, the oxide semiconductor layer 135, the first interlayer insulating film ILD1, and the second gate insulating film GI2. In an embodiment, for example, the first and second recess patterns RC1_2 and RC2_2 may pass through the second interlayer insulating film ILD2, the third gate insulating film GI3, the oxide semiconductor layer 135, and the first interlayer insulating film ILD1 in the thickness direction, and may be defined by removing a part of an upper portion of the second gate insulating film GI2.

Even in this case, since the first and second recess patterns RC1_2 and RC2_2 and the contact holes CNT1 and CNT2 may be formed by one mask process, process efficiency may be improved and process costs may be reduced. In addition, the first and second recess patterns RC1_2 and RC2_2 may be formed in various structures as necessary.

In concluding the detailed description, those skilled in the art will appreciate that many variations and modifications can be made to the embodiments without substantially departing from the principles of the invention. Therefore, the embodiments of the invention are used in a generic and descriptive sense only and not for purposes of limitation.

What is claimed is:

1. A display device comprising:
   a substrate; and
   in order from the substrate:
      a recessed interlayer insulating layer in which a recess is defined, the recessed interlayer insulating layer including a side wall and an upper surface together defining the recess;
      an oxide semiconductor active layer of a first transistor, in which a first through-hole is defined, the oxide semiconductor active layer including an inner wall defining the first through-hole;
      a first gate insulating layer;
      a first conductive layer;
      a first interlayer insulating layer in which a second through-hole is defined corresponding to the first through-hole, the second through-hole together with the first through-hole defining portions of a through-hole corresponding to the recess of the recessed interlayer insulating layer; and
      a second conductive layer connected to the oxide semiconductor active layer at the through-hole,
      wherein at the through-hole, the second conductive layer which is connected to the oxide semiconductor active layer contacts the inner wall of the oxide semiconductor active layer and contacts both the side wall and the upper surface of the recessed interlayer insulating layer.

2. The display device of claim 1, wherein
   the through-hole which includes the first through-hole together with the second through-hole is provided in plural including a plurality of through-holes, and
   the first transistor further includes:
      a first gate electrode which is defined by the first conductive layer and overlaps the oxide semiconductor active layer,
      a first source/drain electrode and a second source/drain electrode which are defined by the second conductive layer and each electrically connected to the oxide semiconductor active layer, and
      the oxide semiconductor active layer in contact with each of the first source/drain electrode and the second source/drain electrode at the plurality of through-holes, respectively.

3. The display device of claim 2, further comprising:
a light-emitting element,
a second transistor which controls the light-emitting element and includes a non-oxide semiconductor active layer, a second gate electrode which overlaps the non-oxide semiconductor active layer, a first source/drain electrode and a second source/drain electrode, and
a third transistor which is connected to the first source/drain electrode of the second transistor and to which a data voltage is applied, the third transistor including a non-oxide semiconductor active layer,
wherein
the first transistor is connected between the second source/drain electrode of the second transistor and the second gate electrode of the second transistor, and
the oxide semiconductor active layer of the first transistor is in a different layer from the non-oxide semiconductor active layer of each of the second transistor and the third transistor.

4. The display device of claim 3, wherein
the first transistor is an NMOS transistor, and
each of the second transistor and the third transistor is a PMOS transistor.

5. The display device of claim 2, wherein within the first transistor the oxide semiconductor active layer includes:
a channel region corresponding to the first gate electrode,
a first source/drain region and a second source/drain region respectively on opposing sides of the channel region, and
the first through-hole extended through the first source/drain region or the second source/drain region.

6. The display device of claim 1, wherein at the through-hole, the second conductive layer which is connected to the oxide semiconductor active layer directly contacts the inner wall of the oxide semiconductor active layer.

7. The display device of claim 1, further comprising in order from the substrate:
a non-oxide semiconductor active layer of a second transistor;
a second gate insulating layer;
a third conductive layer;
the recessed interlayer insulating layer as a second interlayer insulating layer; and
the oxide semiconductor active layer of the first transistor.

8. The display device of claim 7, further comprising within the first transistor:
a third gate insulating layer between the second gate insulating layer and the second interlayer insulating layer; and
a light blocking pattern between the third gate insulating layer and the second interlayer insulating layer and corresponding to the oxide semiconductor active layer of the first transistor.

9. The display device of claim 1, further comprising within the first transistor:
a third-through hole defined in the first gate insulating layer defines, the third through-hole corresponding to the first through-hole and the second through-hole,
the first through-hole together with the second through-hole and the third through-hole defining portions of the through-hole, and
the first gate insulating layer extending further than the oxide semiconductor active layer of the first transistor in a direction along the substrate.

10. The display device of claim 1, wherein within the first transistor:
the oxide semiconductor active layer of the first transistor includes a side surface,
each of the first gate insulating layer and the first conductive layer has a shape,
the shape of the first gate insulating layer is the same as the shape of the first conductive layer, and
the side surface of the oxide semiconductor active layer is exposed outside of the first gate insulating layer.

11. A display device comprising:
a light-emitting element;
a first transistor which controls the light-emitting element, the first transistor including a first gate electrode, a first semiconductor active layer, a first source/drain electrode and a second source/drain electrode;
a second transistor connected between the second source/drain electrode of the first transistor and the first gate electrode of the first transistor;
a recessed interlayer insulating layer which is common to both the first transistor and the second transistor and in which a recess is defined, the recessed interlayer insulating layer including a side wall and an upper surface together defining the recess; and
the second transistor including:
a second semiconductor active layer in which a through-hole is defined, the second semiconductor active layer including an inner wall defining the through-hole, and
a first source/drain electrode and a second source/drain electrode in contact with the second semiconductor active layer at the inner wall and with the recessed interlayer insulating layer at the side wall and at the upper surface,
wherein
each of the first semiconductor active layer and the second semiconductor active layer includes a semiconductor material, and
the semiconductor material of the first semiconductor active layer of the first transistor is different from the semiconductor material of the second semiconductor active layer of the second transistor.

12. The display device of claim 11, wherein the second transistor further includes:
a second gate electrode,
the second semiconductor active layer including a channel region corresponding to the second gate electrode,
a first source/drain region and a second source/drain region respectively on opposing sides of the channel region, and
the through-hole defined in the first source/drain region or the second source/drain region.

13. The display device of claim 12, wherein within the second transistor:
the through-hole is provided in plurality including a first through-hole in the first source/drain region of the second semiconductor active layer and a second through-hole in the second source/drain region of the second semiconductor active layer,
the first source/drain region and the second source/drain region each including an inner wall defining the first through-hole and the second through-hole, respectively, and
the first source/drain electrode and the second source/drain electrode of the second transistor in direct contact with the inner wall of the first source/drain region and the inner wall of the second source/drain region, respectively.

14. The display device of claim 13, wherein
the first semiconductor active layer includes a non-oxide semiconductor, and
the second semiconductor active layer includes an oxide semiconductor.

15. The display device of claim 14, wherein
the first transistor is a PMOS transistor, and
the second transistor is an NMOS transistor.

16. The display device of claim 11, further comprising a third transistor electrically connected to the first source/drain electrode of the first transistor and to which a data signal is applied,
wherein the third transistor includes:
a third semiconductor active layer including a semiconductor material, and
the semiconductor material of the third semiconductor active layer of the third transistor is the same as the semiconductor material of the first semiconductor active layer of the first transistor.

\* \* \* \* \*